US011742261B2

(12) United States Patent
Mahajan et al.

(10) Patent No.: US 11,742,261 B2
(45) Date of Patent: Aug. 29, 2023

(54) NESTED ARCHITECTURES FOR ENHANCED HETEROGENEOUS INTEGRATION

(71) Applicant: Intel Corporation, Santa Clara, CA (US)

(72) Inventors: Ravindranath Mahajan, Chandler, AZ (US); Debendra Mallik, Chandler, AZ (US); Sujit Sharan, Chandler, AZ (US); Digvijay Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/089,535

(22) Filed: Dec. 27, 2022

(65) Prior Publication Data

US 2023/0133429 A1 May 4, 2023

Related U.S. Application Data

(63) Continuation of application No. 16/291,314, filed on Mar. 4, 2019.

(51) Int. Cl.

| *H01L 23/48* | (2006.01) |
| *H01L 21/56* | (2006.01) |
| *H01L 21/768* | (2006.01) |
| *H01L 23/31* | (2006.01) |
| *H01L 23/34* | (2006.01) |
| *H01L 23/538* | (2006.01) |
| *H01L 23/00* | (2006.01) |
| *H01L 25/18* | (2023.01) |

(52) U.S. Cl.
CPC .......... *H01L 23/481* (2013.01); *H01L 21/565* (2013.01); *H01L 21/76898* (2013.01); *H01L 23/315* (2013.01); *H01L 23/3128* (2013.01); *H01L 23/34* (2013.01); *H01L 23/5383* (2013.01); *H01L 23/5386* (2013.01);

(Continued)

(58) Field of Classification Search
CPC ................. H01L 23/481; H01L 21/565; H01L 21/76898; H01L 23/3128; H01L 23/315; H01L 23/34; H01L 23/5383; H01L 23/5386; H01L 24/09; H01L 24/17;

(Continued)

(56) References Cited

U.S. PATENT DOCUMENTS

| 6,711,904 B1 | 3/2004 | Law et al. |
| 7,402,901 B2 | 7/2008 | Hatano |

(Continued)

FOREIGN PATENT DOCUMENTS

| EP | 0660399 | 6/1995 |
| EP | 2958142 | 12/2015 |
| EP | 3131117 | 2/2017 |

OTHER PUBLICATIONS

Extended European Search Report for European Patent Application No. 20155202.3 dated Jul. 7, 2020, 8 pgs.

(Continued)

*Primary Examiner* — Robert G Bachner
(74) *Attorney, Agent, or Firm* — Schwabe, Williamson & Wyatt, P.C.

(57) ABSTRACT

Embodiments disclosed herein include electronic packages and methods of forming such electronic packages. In an embodiment, the electronic package comprises a base substrate. The base substrate may have a plurality of through substrate vias. In an embodiment, a first die is over the base substrate. In an embodiment a first cavity is disposed into the base substrate. In an embodiment, the first cavity is at least partially within a footprint of the first die. In an embodiment, a first component is in the first cavity.

20 Claims, 17 Drawing Sheets

(52) U.S. Cl.
CPC .............. *H01L 24/09* (2013.01); *H01L 24/17* (2013.01); *H01L 24/29* (2013.01); *H01L 24/73* (2013.01); *H01L 25/18* (2013.01); *H01L 2224/73253* (2013.01)

(58) Field of Classification Search
CPC ......... H01L 24/29; H01L 24/73; H01L 25/18; H01L 2224/73253
See application file for complete search history.

(56) References Cited

U.S. PATENT DOCUMENTS

| | | |
|---|---|---|
| 2008/0136002 A1 | 6/2008 | Yang |
| 2008/0229759 A1 | 9/2008 | Quyang |
| 2012/0319295 A1 | 12/2012 | Chi et al. |
| 2013/0241026 A1 | 9/2013 | Or-Bach |
| 2014/0264791 A1 | 9/2014 | Manusharow et al. |
| 2016/0086930 A1 | 3/2016 | Koey et al. |
| 2016/0093583 A1 | 3/2016 | Yu |
| 2016/0302308 A1 | 10/2016 | Lee |
| 2017/0047308 A1 | 2/2017 | Ho |
| 2018/0040548 A1 | 2/2018 | Kim |
| 2018/0102311 A1 | 4/2018 | Shih |
| 2018/0175001 A1 | 6/2018 | Pyo |
| 2018/0358298 A1 | 12/2018 | Zhai |

OTHER PUBLICATIONS

Office Action for European Patent Application No. 20155202.3 dated Apr. 26, 2022, 5 pgs.
Search Report for European Patent Application No. 22217082.1 dated May 11, 2023, 12 pgs.

NESTED ARCHITECTURES FOR ENHANCED HETEROGENEOUS INTEGRATION

CROSS-REFERENCE TO RELATED APPLICATIONS

This application is a continuation of U.S. patent application Ser. No. 16/291,314, filed on Mar. 4, 2019, the entire contents of which is hereby incorporated by reference herein.

TECHNICAL FIELD

Embodiments of the present disclosure relate to electronic packaging, and more particularly, to multi-chip packaging architectures with one or more dies attached to a base substrate and one or more components embedded in cavities in the base substrate.

BACKGROUND

The demand for increased performance and reduced form factor are driving packaging architectures towards multi-chip integration architectures. Multi-chip integration allows for dies manufactured at different process nodes to be implemented into a single electronic package. However, current multi-chip architectures result in larger form factors that are not suitable for some use cases, or are not otherwise desirable to end users.

EMBODIMENTS OF THE PRESENT DISCLOSURE

Described herein are multi-chip packaging architectures with one or more dies attached to a base substrate and one or more components embedded in cavities in the base substrate and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the trends in electronic packaging architectures are driving towards the use of multi-chip architectures. However, form factors are not currently at desired levels. Accordingly, embodiments disclosed herein include multi-chip package architectures with improved form factor. Particularly, embodiments disclosed herein allow for homogenous or heterogeneous integrations over a base substrate. Furthermore, the base substrate may comprise one or more cavities that allow for additional components to be located below (and at least partially within the footprint of) the dies. Accordingly, the form factor is improved by reducing the overall footprint in the X-Y plane, as well as reducing the Z-height. Positioning the additional components within the footprint of the one or more dies also reduces the length of signal paths between dies and the additional components. As such, signal integrity is optimized.

Figure 1A:
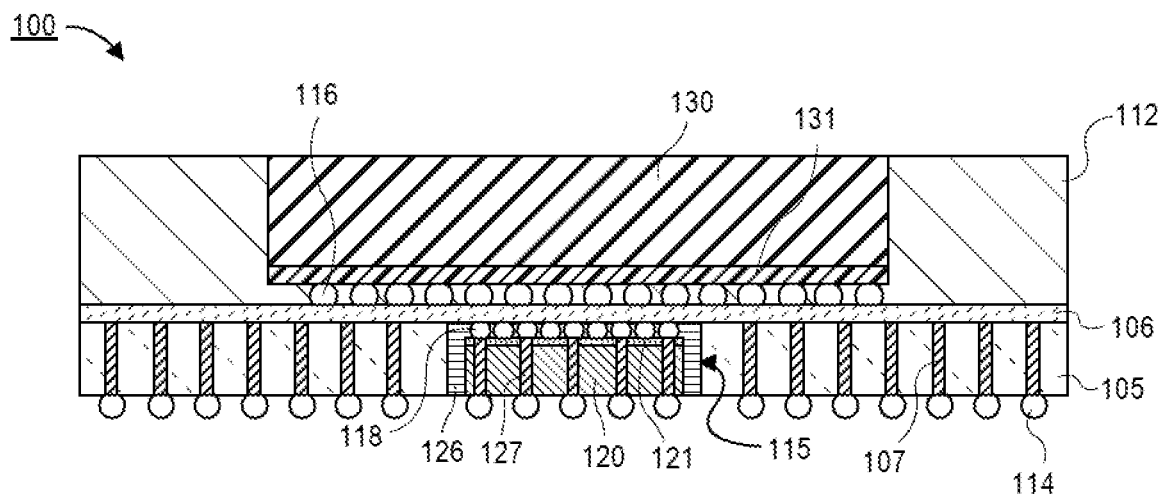
FIG. 1A is a cross-sectional illustration of an electronic package with a base substrate having a first die and a first component embedded in a cavity in the base substrate below the first die, in accordance with an embodiment.

Referring now to FIG. 1A, a cross-sectional illustration of an electronic package 100 is shown, in accordance with an embodiment. In an embodiment, the electronic package 100 may comprise a base substrate 105. The base substrate 105 may be a silicon substrate in some embodiments. The base substrate 105 may comprise signaling traces, pads, and the like (not shown) proximate to surface 106 of the base substrate. The surface 106 may be referred to herein as a redistribution layer (or layers), a back end of line (BEOL) stack, or the like. In an embodiment, the base substrate 105 is a passive substrate. That is, only passive components (e.g., pads, traces, vias, etc.) are fabricated on the base substrate 105. In other embodiments, the base substrate 105 is an active substrate. That is, active circuitry (e.g., transistors, etc.) may be fabricated on the base substrate.

In an embodiment, a plurality of through substrate vias (TSVs) 107 (also referred to as through silicon vias when the base substrate is a silicon substrate) may pass through a thickness of the base substrate 105. TSVs 107 may provide electrical connections between surfaces of the base substrate 105. For example, package side bumps (PSBs) 114 may be electrically coupled to features in the surface 106 of the base substrate 105.

In an embodiment, a die 130 may be attached to the base substrate 105. For example, first level interconnects (FLIs) 116 may electrically couple the die 130 to the surface 106 of the base substrate 105. In an embodiment, the die 130 may have an active surface 131 (i.e., the surface proximate to where active circuitry is fabricated). The active surface 131 may be oriented to face the surface 106 of the base substrate 105. In an embodiment, the die 130 is embedded in a mold layer 112. In some embodiments, a backside surface of the die 130 opposite from the active surface 131 may be exposed. In other embodiments, the backside surface of the die 130 is covered by the mold layer 112.

In an embodiment, a cavity 115 is formed into the base substrate 105. The cavity 115 may pass through a thickness of the base substrate 105 and end at the surface 106 of the base substrate 105. In an embodiment, the cavity 115 may be at least partially within a footprint of the die 130. As used herein, "within a footprint" refers to being positioned within an outer perimeter of a given feature. For example, the cavity 115 is within the outer perimeter of the die 130 in FIG. 1A.

In an embodiment, a component 120 may be positioned in the cavity 115. The component 120 may be any of a variety of different component types, such as a die or die stack (e.g., a processor die, a memory die, a power die, a communication die, etc.), a passive component (e.g., a bridge, a capacitor, an inductor, etc.), a cooling module (e.g., a thermoelectric cooling (TEC) module), or the like. In embodiments where the component 120 is a die or a die stack, the component 120 may be fabricated at a first process node and the die 130 may be fabricated at a second process node. In some embodiments, the first process node may be different than the second process node.

In an embodiment, the component 120 may have an active surface 121. The active surface 121 may be electrically coupled to the backside surface with one or more TSVs 127. In an embodiment, the active surface 121 may be oriented in a face-to-face configuration with the die 130. That is, the active surface 121 of the component 120 may face the active surface 131 of the die 130. In an embodiment, the component 120 may be coupled to the surface 106 of the base substrate 105 with FLIs 118.

In an embodiment, the component 120 may be embedded in a mold layer 126. The mold layer 126 may substantially fill the remaining portion of the cavity 115 that is not occupied by the component 120, the FLIs 118, and any underfill material (not shown) surrounding the FLIs 118. In an embodiment, a backside surface of the component 120 may be exposed (i.e., not covered by the mold layer 126). In other embodiments, the mold layer 126 may cover the backside surface of the component 120.

Figure 1B:
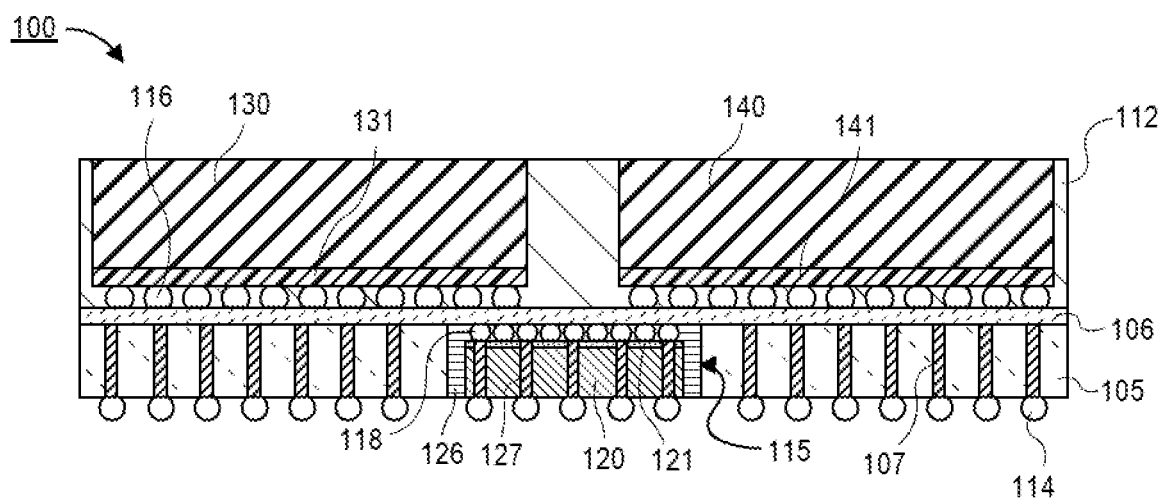
FIG. 1B is a cross-sectional illustration of an electronic package with a base substrate having a first die, a second die, and a component embedded in a cavity in the base substrate below the first die and the second die, in accordance with an embodiment.

Referring now to FIG. 1B, a cross-sectional illustration of an electronic package 100 with a first die 130 and a second die 140 is shown, in accordance with an embodiment. In an embodiment, the electronic package 100 in FIG. 1B may be substantially similar to the electronic package 100 in FIG. 1A, with the exception that a second die is added and the position of the cavity 115 is moved.

As shown in FIG. 1B, a second die 140 may be positioned over the surface 106 of the base substrate 105. That is, the second die 140 may be laterally adjacent to the first die 130. In an embodiment, the second die 140 has an active surface 141 that faces the surface 106 of the base substrate 105. In an embodiment, the first die 130 is different than the second die 140. For example, the first die 130 may be fabricated at a first process node and the second die 140 may be fabricated at a second (different) process node. In other embodiments, the first die 130 may be substantially similar to the second die 140. For example, the first die 130 and the second die 140 may be processor dies that are electrically coupled together by a bridge (or any other interconnect) in order to function as a monolithic die.

In an embodiment, the cavity 115 may be positioned at least partially within a footprint of the first die 130 and at least partially within a footprint of the second die 140. That is, the cavity 115 may span a gap separating the first die 130 from the second die 140. Such an embodiment may be particularly beneficial when the component 120 is coupled to both the first die 130 and the second die 140. For example, the component 120 may be a bridge (e.g., an embedded multi-die interconnect bridge (EMIB)) that electrically couples the first die 130 to the second die 140. Alternative embodiments may include a component 120 that is a memory device (or any other component) that is accessible by both the first die 130 and the second die 140.

Figure 1C:
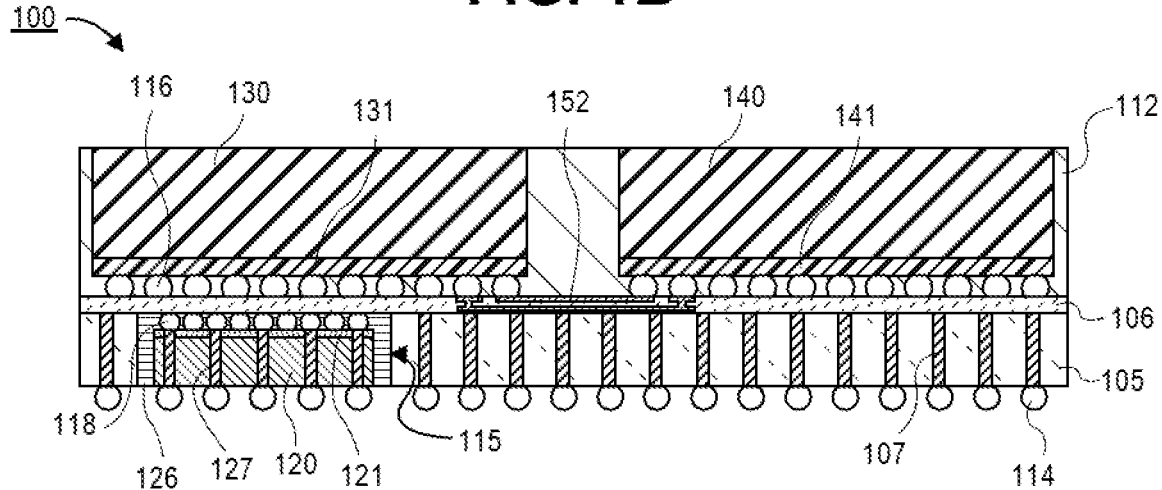
FIG. 1C is a cross-sectional illustration of an electronic package with a base substrate having a first die, a second die, and a component embedded in a cavity in the base substrate below the first die, in accordance with an embodiment.

Referring now to FIG. 1C, a cross-sectional illustration of an electronic package 100 with a first die 130 and a second die 140 is shown, in accordance with an additional embodiment. The electronic package 100 in FIG. 1C is substantially similar to the electronic package 100 in FIG. 1B, with the exception of the location of the cavity 115. As shown, the cavity 115 is entirely within a footprint of the first die 130. Such an embodiment may be particularly beneficial when the component 120 is only accessed by a single one of the dies (e.g., the first die 130).

In an embodiment, the electronic package 100 in FIG. 1C may also differ from the electronic package 100 in FIG. 1B in that traces 152 are fabricated in the surface 106 of the base substrate 105 to provide a connection between the first die 130 and the second die 140. In embodiments where the base substrate 105 is a silicon substrate, traces with fine line spacing (FLS) may be patterned directly onto the base substrate 105 and there may not be a need for a dedicated bridge die to couple the first die 130 to the second die 140.

Figure 1D:
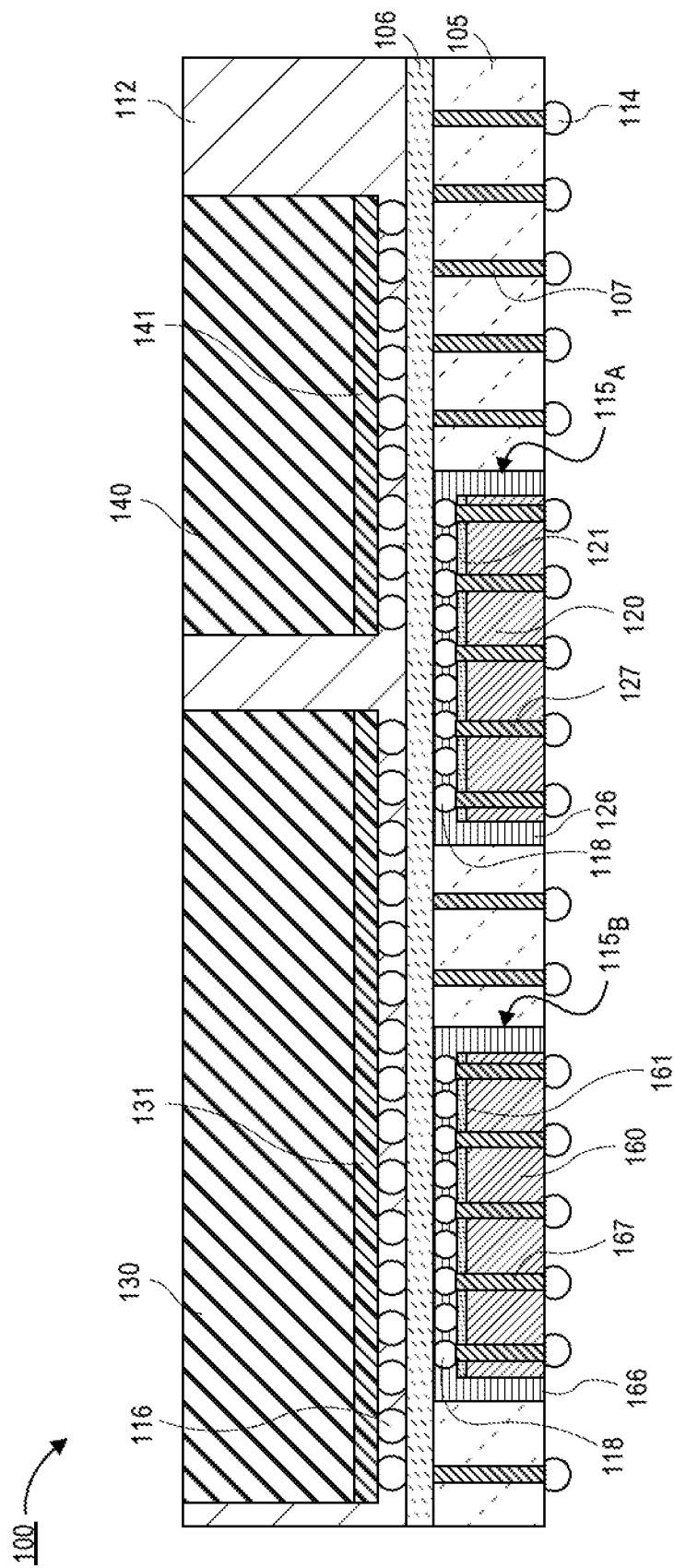
FIG. 1D is a cross-sectional illustration of an electronic package with a base substrate having a first die, a second die, a first component embedded in a first cavity in the base substrate, and second component embedded in a second cavity in the base substrate, in accordance with an embodiment.

Referring now to FIG. 1D, a cross-sectional illustration of an electronic package 100 with a first component 120 and a second component 160 is shown, in accordance with an embodiment. The electronic package 100 in FIG. 1D may be substantially similar to the electronic package 100 in FIG. 1B, with the exception that a second cavity 115E and a second component 160 are positioned in the base substrate 105. In an embodiment, the first cavity 115A and the first component 120 may be at least partially within a footprint of the first die 130 and at least partially within a footprint of the second die 140, and the second cavity 115E and the second component 160 may be entirely within a footprint of the first die 130.

In an embodiment, the second component 160 may be any of a variety of different component types, such as a die or die stack (e.g., a processor die, a memory die, a power die, a communication die, etc.), a passive component (e.g., a bridge, a capacitor, an inductor, etc.), a cooling module (e.g., a TEC module), or the like. In embodiments where the second component 160 is a die or a die stack, the second component 160 may be fabricated at a first process node and the die 130 may be fabricated at a second process node. In some embodiments, the first process node may be different than the second process node. In an embodiment, the first component 120 and the second component 160 may be the same component. In other embodiments, the first component 120 and the second component 160 may be different components.

In an embodiment, the second component 160 may comprise an active surface 161. The active surface 161 may be oriented in a face-to-face configuration with the first die 130. The second component 160 may be electrically coupled to the surface 106 of the base substrate 105 with FLIs 118. In an embodiment, TSVs 167 may pass through the second component 160 to provide electrical connections from a backside surface of the second component 160 to the active surface 161 of the second component 160. In an embodiment, the second component 160 may be embedded in a mold layer 166. As shown in FIG. 1D, the mold layer 166 does not cover the backside surface of the second component 160. Other embodiments may include the mold layer 166 covering the backside surface of the second component 160.

Figure 1E:
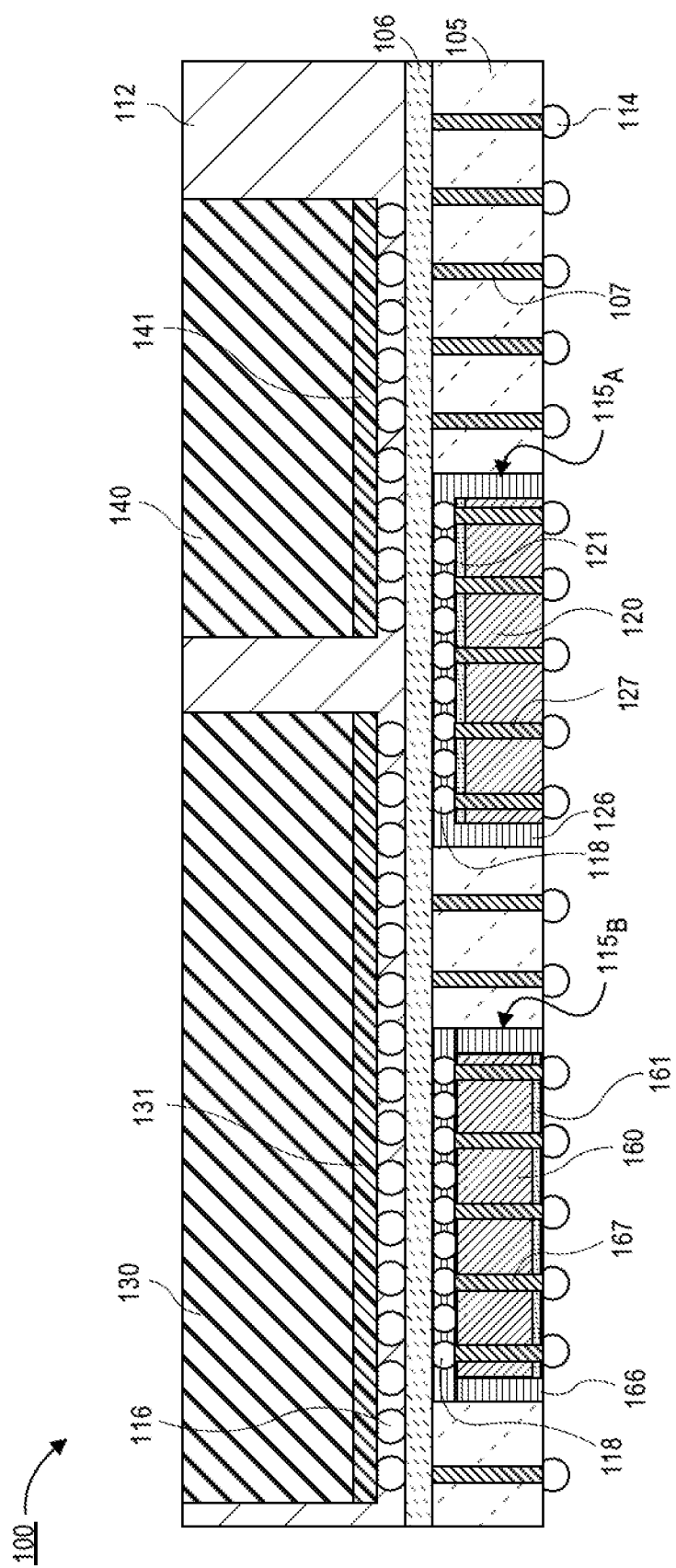
FIG. 1E is a cross-sectional illustration of an electronic package with a base substrate having a first die, a second die, a first component with a face-to-face configuration with the first die and the second die, and a second component with a back-to-face configuration with the first die and the second die, in accordance with an embodiment.

Referring now to FIG. 1E, a cross-sectional illustration of an electronic package 100 with a first component 120 and a second component 160 is shown, in accordance with an embodiment. The electronic package 100 in FIG. 1E is substantially similar to the electronic package 100 in FIG. 1D, with the exception that the second component 160 is oriented in a different direction. As shown, the second component 160 is oriented with the active surface 161 facing away from the active surface 131 of the first die 130 (i.e., a face-to-back configuration). As such, the first component 120 and the second component 160 are oriented in opposite directions. However, it is to be appreciated that in some embodiments, both the first component 120 and the second component 160 may be oriented in a face-to-back configuration with the first die 130 and the second die 140.

Figure 1F:
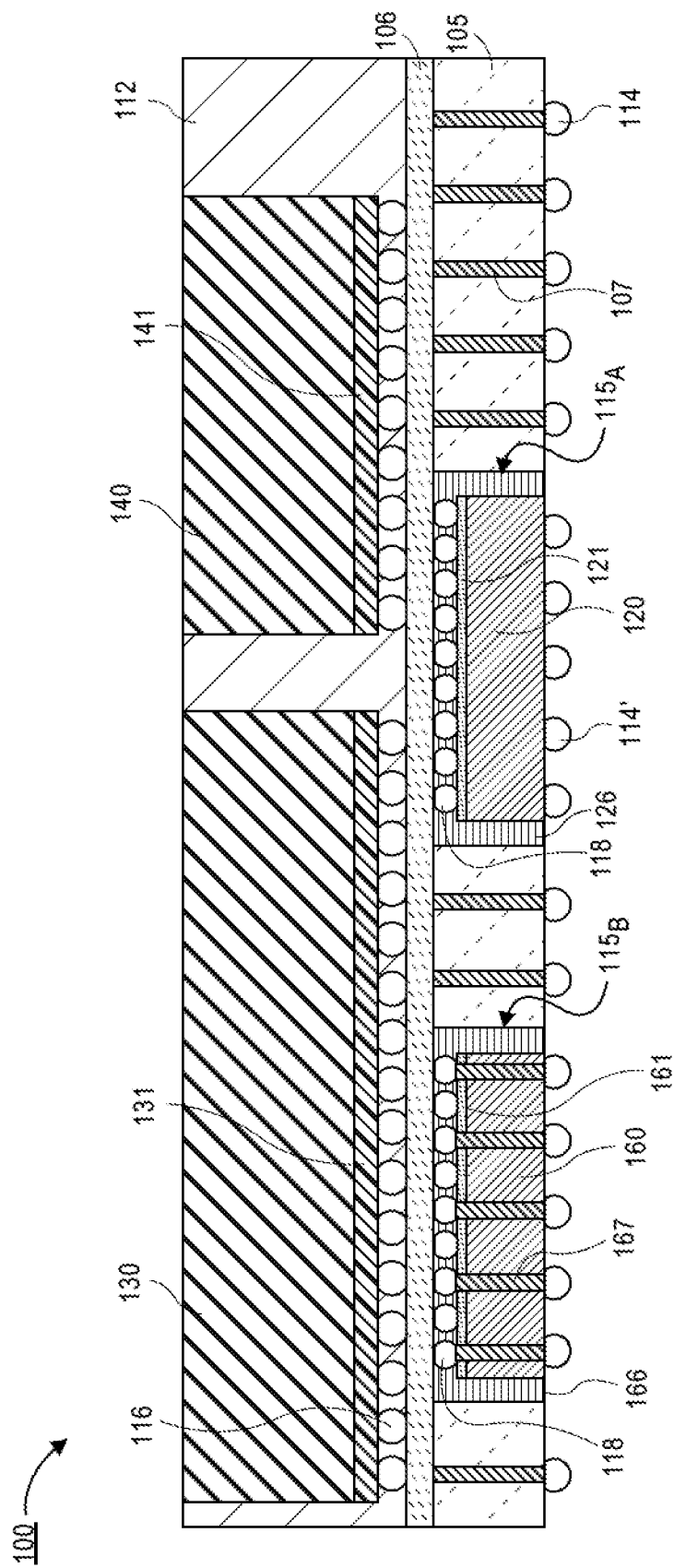
FIG. 1F is a cross-sectional illustration of an electronic package with a base substrate having a first die, a second die, a first component without through substrate vias, and a second component with through substrate vias, in accordance with an embodiment.

Referring now to FIG. 1F, a cross-sectional illustration of an electronic package 100 with a first component 120 and a second component 160 is shown, in accordance with an embodiment. The electronic package 100 in FIG. 1F may be substantially similar to the electronic package 100 in FIG. 1D, with the exception that the first component 120 does not include TSVs. In an embodiment, dummy PSBs 114' may be positioned on the backside surface of the first component 120 in order to provide structural robustness. "Dummy PSBs" 114' refer to PSBs that are not electrically coupled to other circuitry of the electronic package 100. While the second component 160 is shown as having TSVs 167, it is to be appreciated that in some embodiments, the second component 160 may also omit TSVs 167.

Figure 1G:
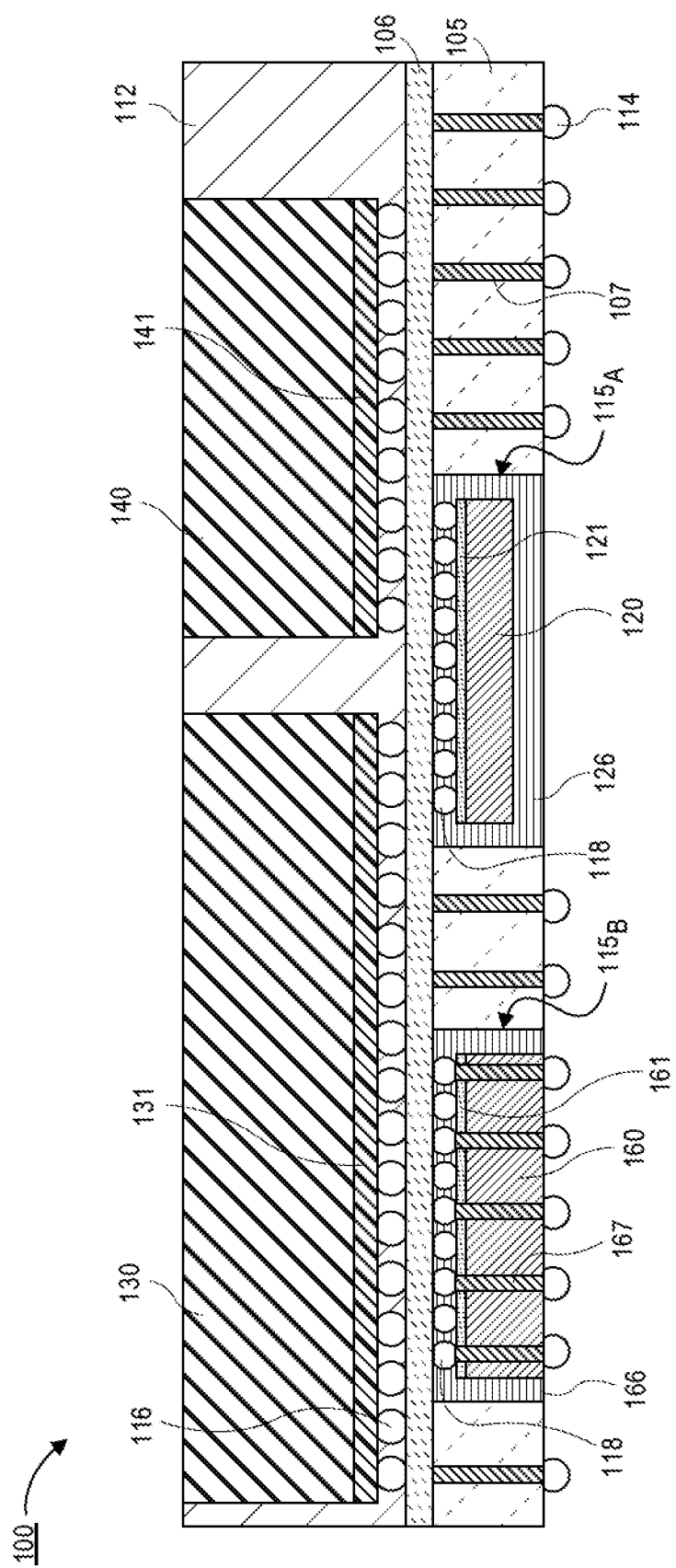
FIG. 1G is a cross-sectional illustration of an electronic package with a base substrate having a first die, a second die, a first component, and a second component, in accordance with an embodiment.

Referring now to FIG. 1G, a cross-sectional illustration of an electronic package 100 with a first component 120 and a second component 160 is shown, in accordance with an embodiment. The electronic package 100 in FIG. 1G is substantially similar to the electronic package 100 in FIG. 1F, with the exception that there are no dummy PSBs 114' below the first component 120. Additionally, the mold layer 126 completely embeds the first component 120 (i.e., the backside surface of the first component 120 is covered by the mold layer 126).

Figure 1H:
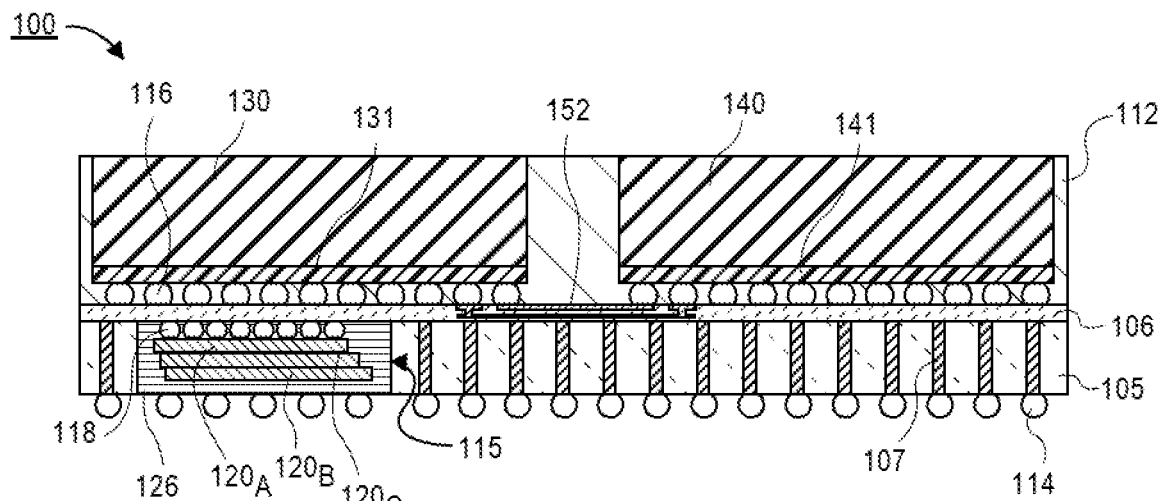
FIG. 1H is a cross-sectional illustration of an electronic package with a base substrate that comprises a stack of dies, in accordance with an embodiment.

Referring now to FIG. 1H, a cross-sectional illustration of an electronic package 100 is shown, in accordance with an additional embodiment. In an embodiment, the electronic package 100 may be substantially similar to the electronic package 1C, with the exception that a plurality of components $120_{A-C}$ are included in the cavity 115. For example, the plurality of components $120_{A-C}$ may comprise a stack of dies (e.g., a memory die stack).

Figure 1I:
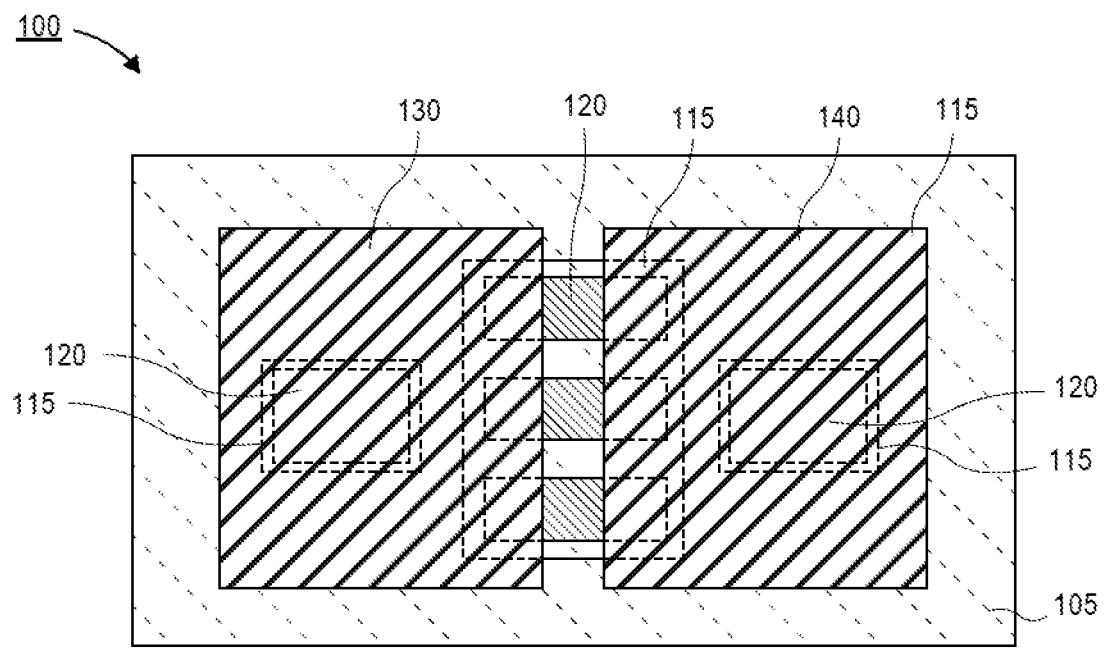
FIG. 1I is a plan view illustration of an electronic package that includes a plurality of bridges in a base substrate that connect a first die to a second die, in accordance with an embodiment.

Referring now to FIG. 1I, a plan view illustration of an electronic package 100 is shown, in accordance with an embodiment. In an embodiment, the electronic package 100 may comprise a first die 130 and a second die 140 placed over a base substrate 105. The first die 130 may be electrically coupled to the second die 140 by a plurality of components 120 (e.g., bridges). In an embodiment, the plurality of components 120 may be disposed in a single cavity 115. In other embodiments, each component 120 may be disposed in separate cavities 115. As shown in FIG. 1I, additional components 120 and cavities 115 may be formed entirely under one of the first die 130 and/or the second die 140.

Figure 1J:
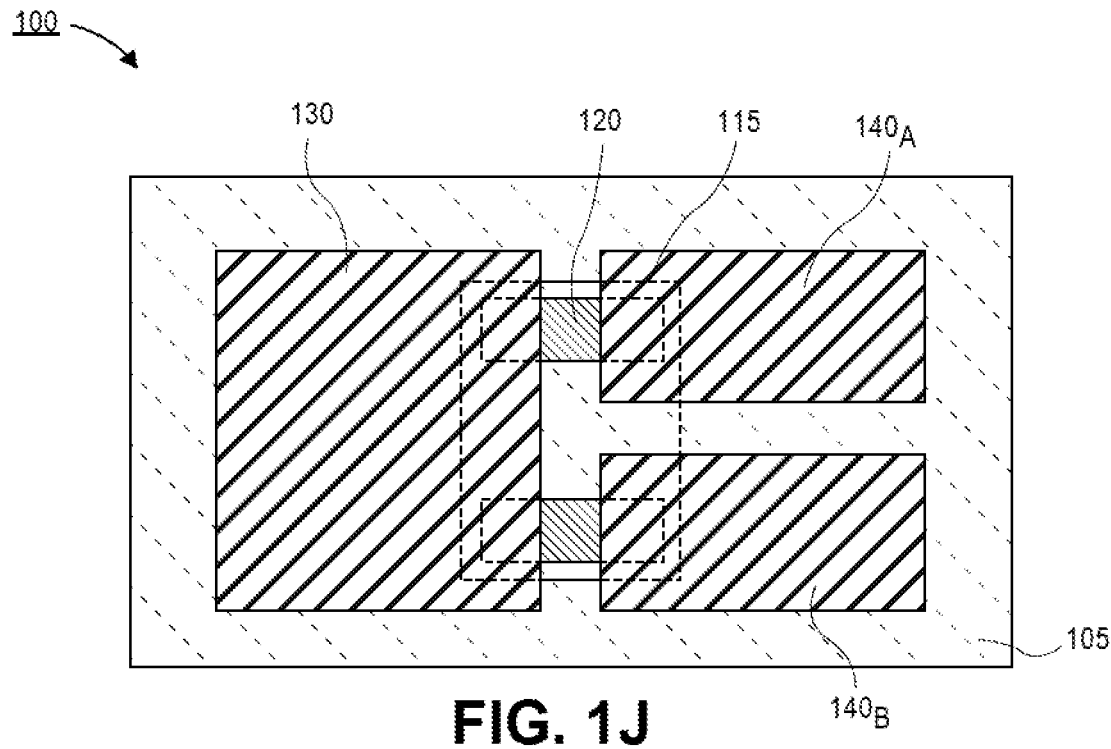
FIG. 1J is a plan view illustration of an electronic package that includes a plurality of bridges in a base substrate that connect a first die to a second die, and the first die to a third die, in accordance with an embodiment.

Referring now to FIG. 1J, a plan view illustration of an electronic package 100 is shown, in accordance with an additional embodiment. In an embodiment, a first die 130, a second die 140A, and a third die 140E may be placed over the base substrate 105. In an embodiment, components 120 embedded in cavities 115 in the base substrate 105 may electrically couple the first die 130 to the second die 140A, and/or electrically couple the first die 130 to the third die 140B.

Figure 1K:
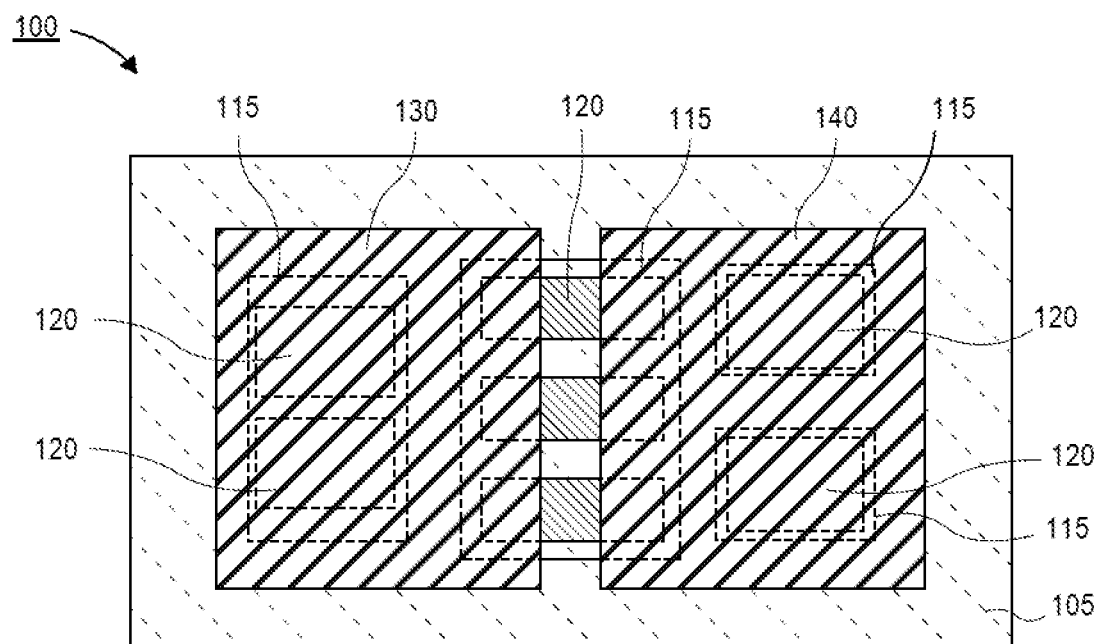
FIG. 1K is a plan view illustration of an electronic package that includes a plurality of bridges in a base die that connect a first die to a second die, and a plurality of dies embedded in the base die below the first die and the second die, in accordance with an embodiment.

Referring now to FIG. 1K, a plan view illustration of an electronic package 100 is shown, in accordance with an additional embodiment. The electronic package 100 in FIG. 1K may be substantially similar to the electronic package 100 in FIG. 1I, with the exception that a cavity 115 below the first die houses a pair of components 120, and a pair of cavities 115 are positioned below the second die 140. Each of the cavities 115 may comprise one or more components 120.

While FIGS. 1A-1G illustrate electronic packages 100 with one, two, or three dies and one or more components embedded in cavities in the base substrate, it is to be appreciated that embodiments are not limited to such configurations. For example, electronic packages may include a plurality of dies (e.g., two or more dies) and/or a plurality of components (e.g., two or more components). Furthermore, each cavity in the base substrate may house one or more components.

Referring now to FIGS. 2A-2J, a series of cross-sectional illustrations depict a process for fabricating an electronic package in accordance with an embodiment. In FIGS. 2A-2J only a single cavity, component, and die are shown for simplicity. However, it is to be appreciated that additional cavities and components and/or dies may also be included in the electronic package using similar processing operations to those described.

Figure 2A:
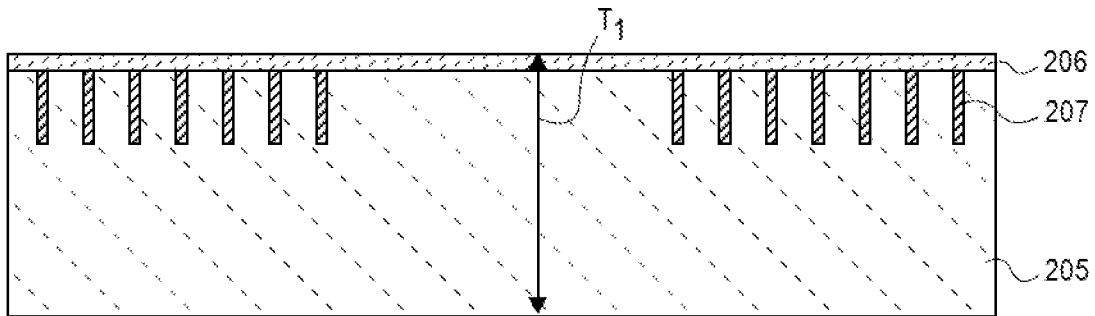
FIG. 2A is a cross-sectional illustration of a base substrate with through substrate vias (TSVs) into the base substrate, in accordance with an embodiment.

Referring now to FIG. 2A, a cross-sectional illustration of a base substrate 205 is shown, in accordance with an embodiment. In an embodiment, the base substrate 205 may be a silicon substrate. The base substrate 205 may have a thickness $T_1$. For example, the thickness $T_1$ may be a standard wafer thickness (e.g., 800 μm).

In an embodiment, a surface 206 of the base substrate 205 may comprise a conductive features (e.g., traces, pads, etc.). In some embodiments, the base substrate 205 is a passive substrate. Other embodiments include an active base substrate 205. For example, the base substrate 205 may comprise transistors or the like. In an embodiment, a plurality of TSVs 207 may be positioned in the base substrate 205. As shown in FIG. 2A, the plurality of TSVs 207 may not extend entirely through the base substrate 205. The TSVs 207 may be omitted from regions where a cavity is desired. For example, there are no TSVs 207 in a central region of the base substrate 205 shown in FIG. 2A.

Figure 2B:
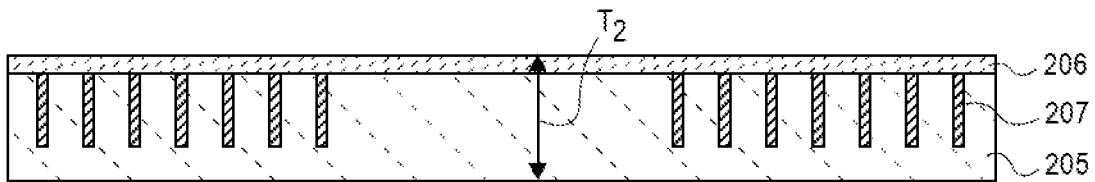
FIG. 2B is a cross-sectional illustration of the base substrate after the base substrate is thinned, in accordance with an embodiment.

Referring now to FIG. 2B, a cross-sectional illustration of the base substrate 205 after the base substrate is thinned is shown, in accordance with an embodiment. For example, the base substrate 205 may be thinned to have a thickness $T_2$ that is approximately 100 μm or less. The base substrate 205 may be thinned with a grinding or polishing process. As shown, thinned base substrate 205 may still have the TSVs 207 fully embedded. That is, the TSVs 207 do not pass completely through the base substrate 205 at this point.

Figure 2C:
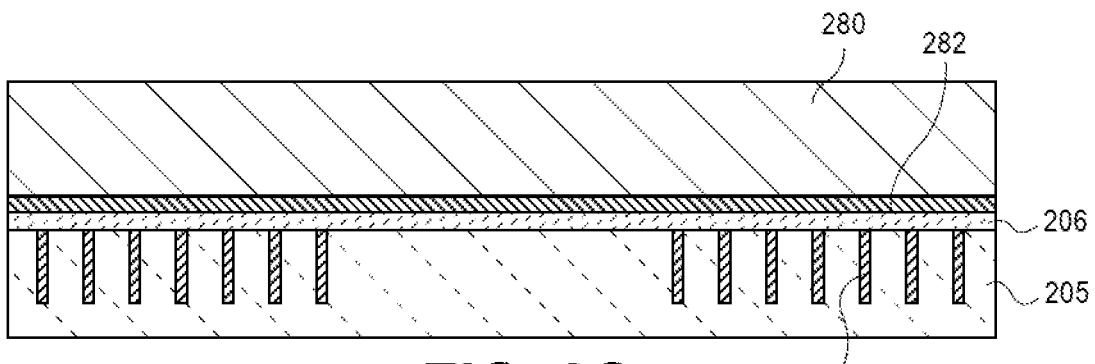
FIG. 2C is a cross-sectional illustration of the base substrate after a carrier is attached, in accordance with an embodiment.

Referring now to FIG. 2C, a cross-sectional illustration of the base substrate 205 after a carrier 280 is attached is shown, in accordance with an embodiment. In an embodiment, the carrier 280 may be secured to the surface 206 of the base substrate 205 by an adhesive film 282.

Figure 2D:
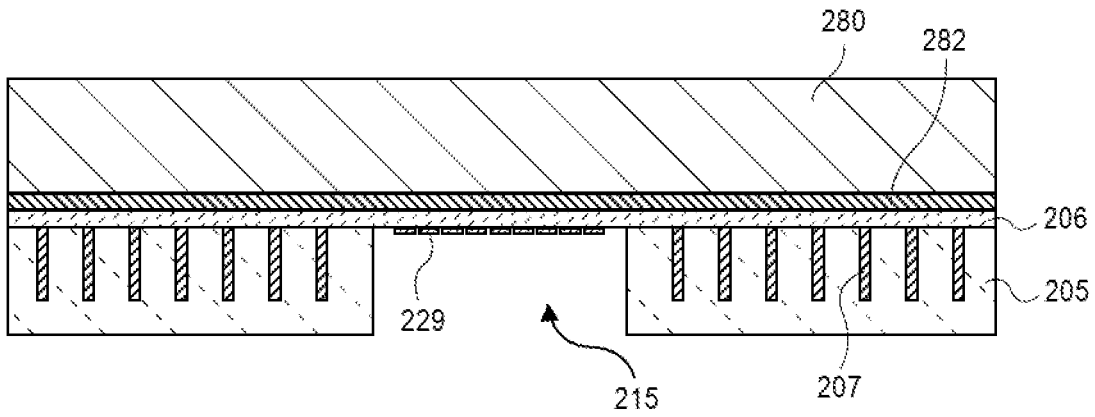
FIG. 2D is a cross-sectional illustration after a cavity is formed into the base substrate, in accordance with an embodiment.

Referring now to FIG. 2D, a cross-sectional illustration of the base substrate 205 after a cavity 215 is formed is shown, in accordance with an embodiment. In an embodiment, the cavity 215 may be formed with an etching process that removes a portion of the base substrate 205. The etching process may be a wet or dry etching process that utilizes a photoresist (not shown) over the base substrate 205 in order to define the boundary of the cavity 215. The cavity 215 may extend through the base substrate 205 and end at the surface 206. In an embodiment, a plurality of pads 229 may be exposed by the cavity 215. The pads 229 may have been fabricated as part of the surface 206 prior to the formation of the cavity 215.

Figure 2E:
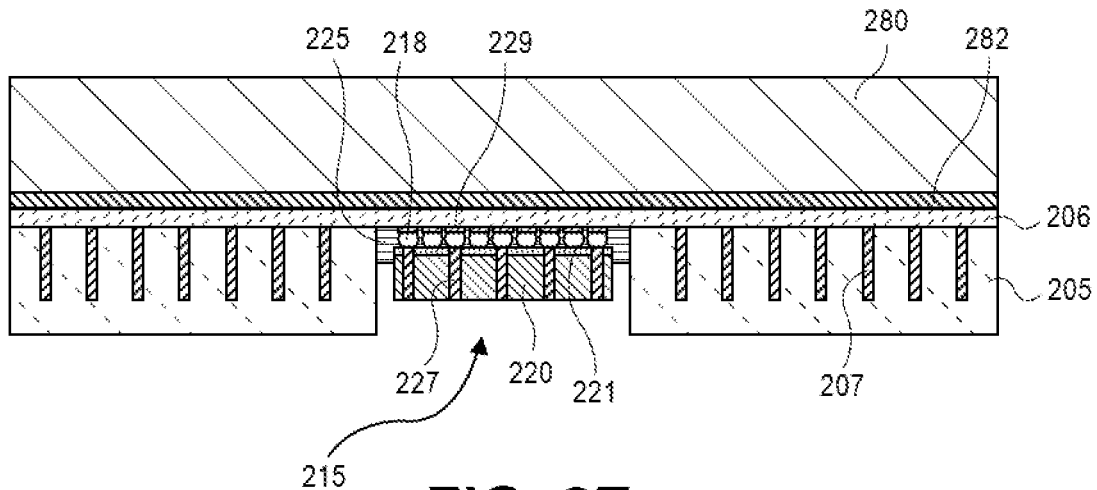
FIG. 2E is a cross-sectional illustration after a component is attached to pads exposed by the cavity, in accordance with an embodiment.

Referring now to FIG. 2E, a cross-sectional illustration of the base substrate 205 after a component 220 is mounted in the cavity 215 is shown, in accordance with an embodiment. The component 220 may be attached to the pads 229 exposed by the cavity 215 by FLIs 218. In an embodiment, the attachment may be a thermocompression bonding (TCB) attachment process. In some embodiments a flux (e.g., epoxy flux) may be used during the attachment process. The FLIs 218 may comprise solder that is reflown between pads. In other embodiments, the FLIs 218 may comprise a copper to copper attachment. After attachment of the component 220 to the pads 229, an underfill material 225 may be dispensed around the FLIs 218.

In an embodiment, the component 220 may comprise any of a variety of different component types, such as a die or die stack (e.g., a processor die, a memory die, a power die, a communication die, etc.), a passive component (e.g., a bridge, a capacitor, an inductor, etc.), a cooling module (e.g., a TEC module), or the like. In an embodiment, the component 220 may comprise an active surface 221. The active surface 221 may be oriented to face the surface 206. However, in other embodiments, the active surface 221 may face away from surface 206 (e.g., similar to the component 160 shown in FIG. 1E). In some embodiments, the backside surface of the component 220 may be electrically coupled to the active surface 221 by one or more TSVs 227. In other embodiments, the TSVs 227 may be omitted (e.g., similar to the component 120 shown in FIG. 1F).

The component 220 may sit completely in the cavity 215. That is, the depth of the cavity 215 may be greater than a combined thickness of the component 220 and the FLIs 218. Accordingly, a backside surface of the component 220 may be recessed below a backside surface of the base substrate 205.

Figure 2F:
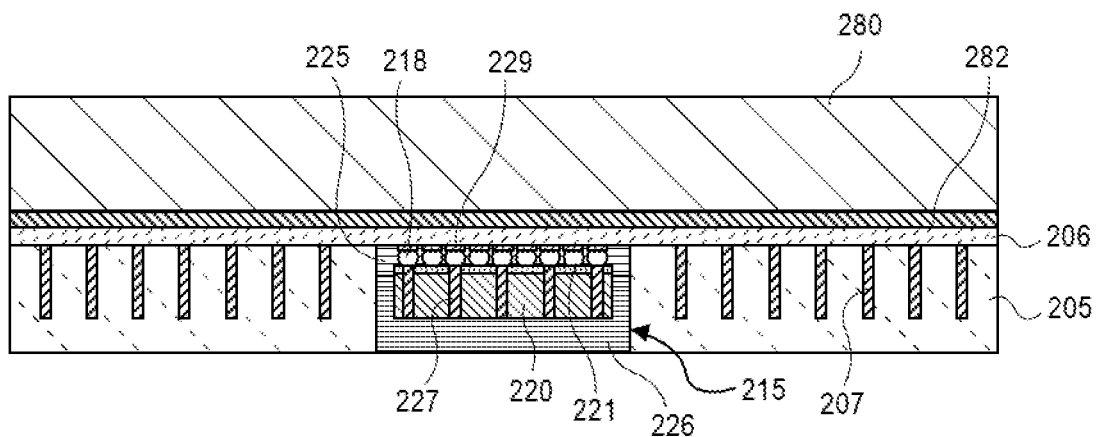
FIG. 2F is a cross-sectional illustration after the component is embedded in a mold layer, in accordance with an embodiment.

Referring now to FIG. 2F, a cross-sectional illustration of the base substrate 205 after the cavity 215 is filled with a mold layer 226 is shown, in accordance with an embodiment. The mold layer 226 may substantially fill the remainder of the cavity 215. In an embodiment, the mold layer 226 may be an epoxy or the like. In some embodiments, the mold layer 226 may also surround the FLIs 218, and in which case, the underfill material 225 may be omitted. The mold layer 226 may also embed the component 220. For example, the mold layer 226 may cover sidewalls and a backside surface of the component 220.

Figure 2G:
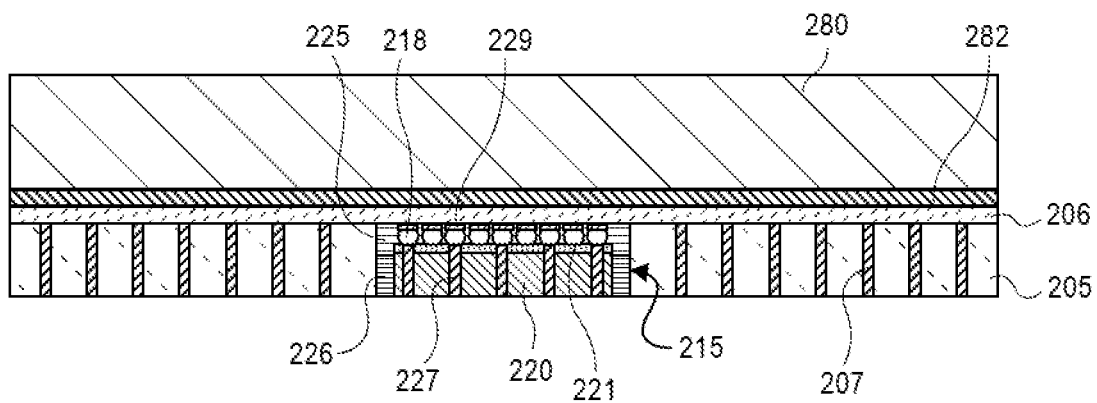
FIG. 2G is a cross-sectional illustration after the base substrate is planarized to expose the TSVs, in accordance with an embodiment.

Referring now to FIG. 2G, a cross-sectional illustration of the base substrate 205 after it has been planarized to expose the TSVs 207 and TSVs 227 is shown, in accordance with an embodiment. In an embodiment, the base substrate 205 may be planarized with a polishing process (e.g., chemical mechanical polishing (CMP) or the like). The polishing process may also recess the mold layer 226 to expose the backside surface of the component 220 and the TSVs 227 (when present).

Figure 2H:
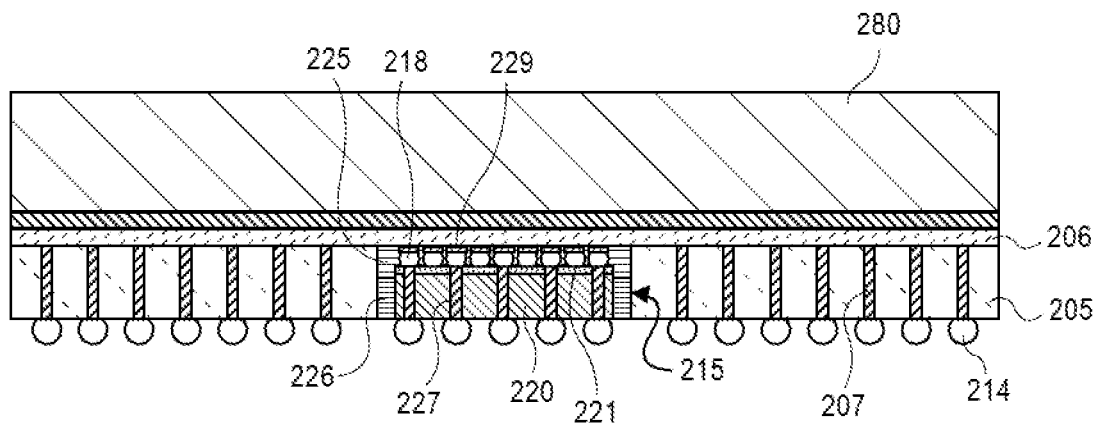
FIG. 2H is a cross-sectional illustration after package side bumps (PSBs) are attached to the TSVs, in accordance with an embodiment.

Referring now to FIG. 2H, a cross-sectional illustration of the base substrate 205 after PSBs 214 are disposed over the TSVs 207 and 227 is shown, in accordance with an embodiment. In an embodiment, the PSBs 214 may comprise a pad or bump (e.g., a copper bump) and/or a solder ball. In an embodiment, the PSBs 214 over the TSVs 207 may be substantially similar to the PSBs 214 over the TSVs 227 of the component 220.

Figure 2I:
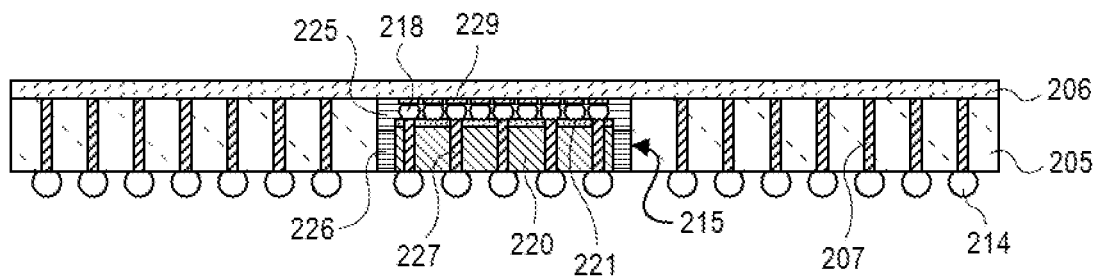
FIG. 2I is a cross-sectional illustration after the carrier is removed, in accordance with an embodiment.

Referring now to FIG. 2I, a cross-sectional illustration after the carrier 280 is removed is shown, in accordance with an embodiment. In an embodiment, the carrier 280 may be removed by mechanically separating the carrier 280. In an embodiment, any residual portion of the adhesive film 282 on the base substrate 205 may be cleaned with suitable cleaning processes.

Figure 2J:
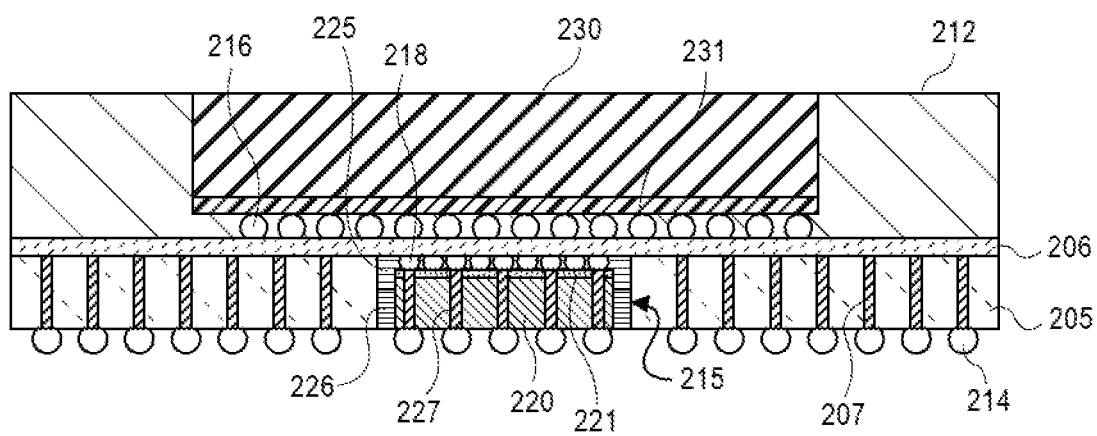
FIG. 2J is a cross-sectional illustration after a die is attached to the base substrate and overmolded, in accordance with an embodiment.

Referring now to FIG. 2J, a cross-sectional illustration after a die 230 is attached to the base substrate 205 is shown, in accordance with an embodiment. In an embodiment, the die 230 may be attached to the base substrate 205 with FLIs 216. For example, the attachment process may be a TCB process or the like. A mold layer 212 may then be formed over the die 230, with suitable processes (e.g., molded underfill (MUF) process). In an embodiment, the mold layer 212 may cover sidewall surfaces of the die 230, and a backside surface of the die 230 may remain exposed. In other embodiments, the backside surface of the die 230 may be covered by the mold layer 212.

In an embodiment, the die 230 may have an active surface 231. The active surface 231 may be oriented to face the surface 206 of the base substrate 205. Accordingly, the die 230 may be referred to as having a face-to-face configuration with the base substrate 205 and with the component 220. In embodiments where the component is oriented with the active surface 221 facing away from surface 206, the die 230 and the component 220 may be referred to as having a face-to-back orientation.

Referring now to FIGS. 3A-3D, a series of cross-sectional illustrations depicting a process for forming an electronic package with a via-last process flow is shown, in accordance with an embodiment.

Figure 3A:
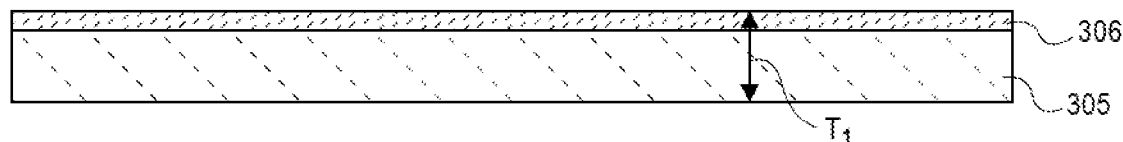
FIG. 3A is a cross-sectional illustration of a base substrate without TSVs, in accordance with an embodiment.

Referring now to FIG. 3A, a cross-sectional illustration of a base substrate 305 is shown, in accordance with an embodiment. The base substrate 305 may be a silicon substrate in some embodiments. In an embodiment, the base substrate 305 may comprise a surface 306. The surface 306 may comprise conductive features (e.g., pads, traces, etc.). In some embodiments where the base substrate 305 is an active substrate, the surfaces 306 may also comprise active circuitry (e.g., transistors or the like). In an embodiment, the base substrate 305 may have a thickness $T_1$. For example, the thickness $T_1$ may be approximately 100 μm or less. It is to be appreciated that the reduced thickness $T_1$ (compared to a typical silicon wafer thickness of 800 μm) may be provided by grinding the base substrate 305 down to a desired thickness. In contrast to the base substrate 205 illustrated in FIG. 2B, the base substrate 305 does not have TSVs at this point in the process flow.

Figure 3B:
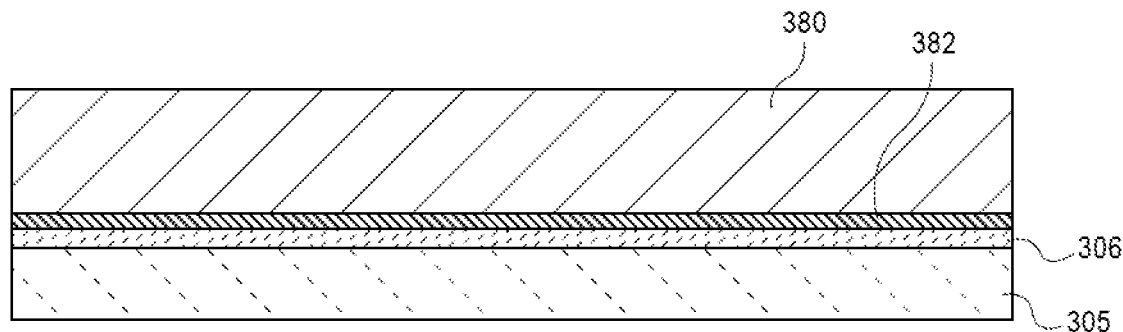
FIG. 3B is a cross-sectional illustration after a carrier is attached to the base substrate, in accordance with an embodiment.

Referring now to FIG. 3B, a cross-sectional illustration of the base substrate 305 after a carrier 380 is attached is shown, in accordance with an embodiment. In an embodiment, the carrier 380 may be secured to the surface 306 of the base substrate 305 by an adhesive film 382.

Figure 3C:
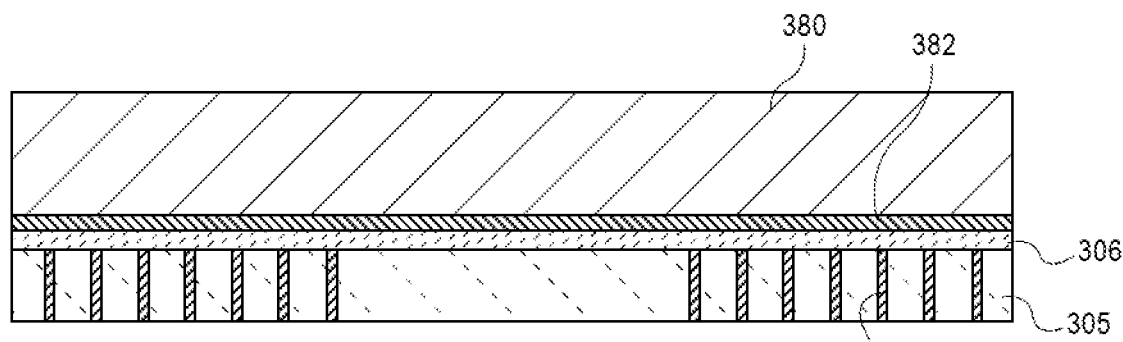
FIG. 3C is a cross-sectional illustration after TSVs are formed in the base substrate, in accordance with an embodiment.

Referring now to FIG. 3C, a cross-sectional illustration of the base substrate 305 after TSVs 307 are formed is shown, in accordance with an embodiment. In an embodiment, the TSVs 307 may be formed by creating openings through the base substrate 305 and filling the openings with a conductive material. The openings may be formed with an etching process using a photoresist (not shown) as a mask. The TSVs 307 may have a surface exposed at the backside surface of the base substrate 305.

Figure 3D:
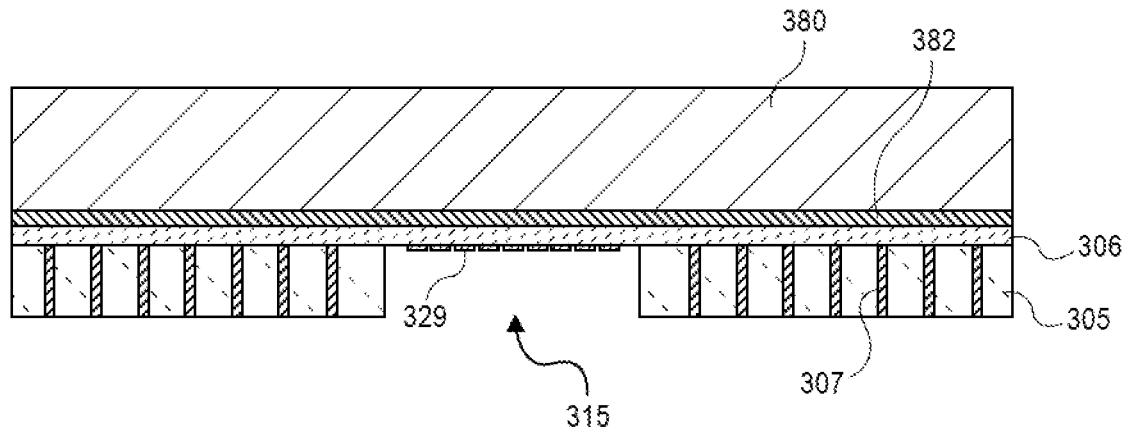
FIG. 3D is a cross-sectional illustration after a cavity is formed into the base substrate, in accordance with an embodiment.

Referring now to FIG. 3D, a cross-sectional illustration of the base substrate after a cavity is formed is shown, in accordance with an embodiment. In an embodiment, the cavity 315 may be formed with an etching process that removes a portion of the base substrate 305. The etching process may be a wet or dry etching process that utilizes a photoresist (not shown) over the base substrate 305 in order to define the boundary of the cavity 315. The cavity 315 may extend through the base substrate 305 and end at the surface 306. In an embodiment, a plurality of pads 329 may be exposed by the cavity 315. The pads 329 may have been fabricated as part of the surface 306 prior to the formation of the cavity 315.

After formation of the cavity 315, the processing may continue with substantially the same processing operations detailed with respect to FIGS. 2E-2J in order to provide an electronic package in accordance with an embodiment.

Referring now to FIGS. 4A-4D a series of cross-sectional illustrations depicting a process for forming a cavity and disposing a component in the cavity is shown in greater detail, in accordance with an embodiment.

Figure 4A:
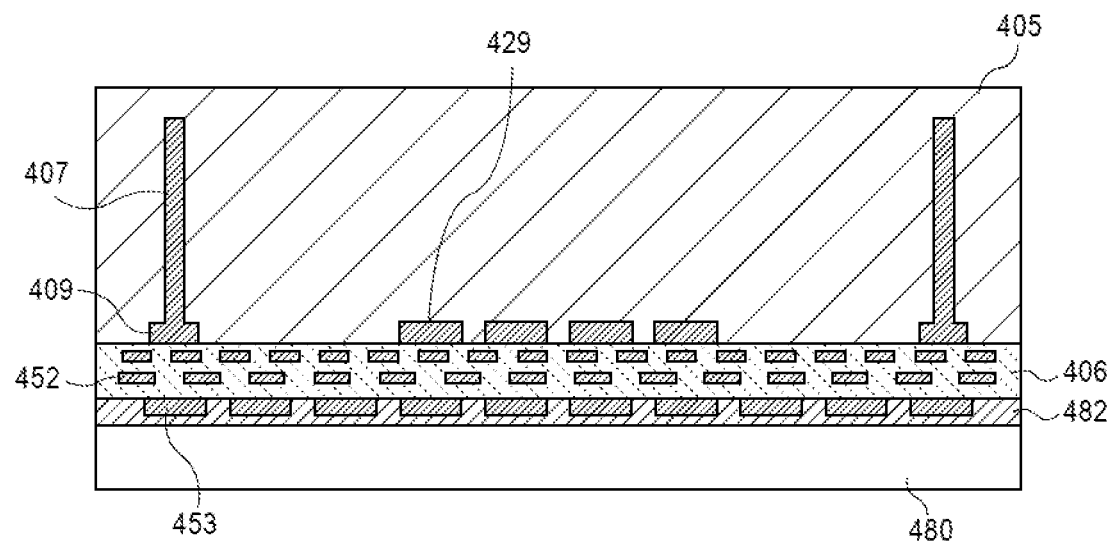
FIG. 4A is a cross-sectional illustration of a base substrate with TSVs that are still fully embedded, in accordance with an embodiment.

Referring now to FIG. 4A, a cross-sectional illustration of a base substrate 405 on a carrier 480 is shown, in accordance with an embodiment. The base substrate 405 may be attached to the carrier 480 with an adhesive film 482. The adhesive film may cover the surface 406 of the base substrate 405 and any pads 453 over the surface 406. In some embodiments, the surface 406 may comprise conductive features 452, such as traces, pads, vias, and the like that will provide interconnections to components and dies of the electronic package.

In an embodiment, a plurality of pads 429 may be formed along the surface 406 and embedded in the body of the base substrate 405. The pads 429 are located where the component will be attached in a subsequent processing operation. In some embodiments, the pads 429 may be separated from the surface 406 by an insulative liner (e.g., SiN or the like). In an embodiment, the base substrate 405 may also comprise TSVs 407 that are over pads 409. The TSVs 407 may not extend entirely through the base substrate 405 at this point in the process flow.

Figure 4B:
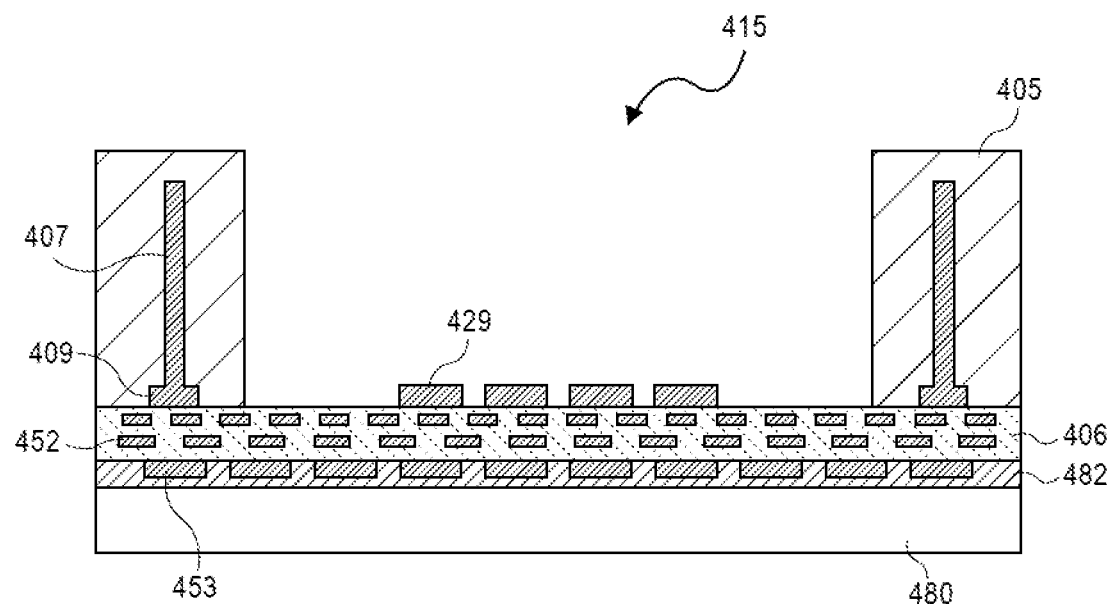
FIG. 4B is a cross-sectional illustration of a cavity formed into the base substrate to expose pads, in accordance with an embodiment.

Referring now to FIG. 4B, a cross-sectional illustration of the base substrate 405 after a cavity 415 is formed is shown, in accordance with an embodiment. In an embodiment, the cavity 415 may be formed into the base substrate 405 through the backside surface. The cavity 415 may be positioned between TSVs 207 and expose the pads 429. In some embodiments, the cavity 415 may be lined with a lining (not shown) such as a nitride. The exposed pads 429 may also be plated with a conductive barrier layer, or the like.

Figure 4C:
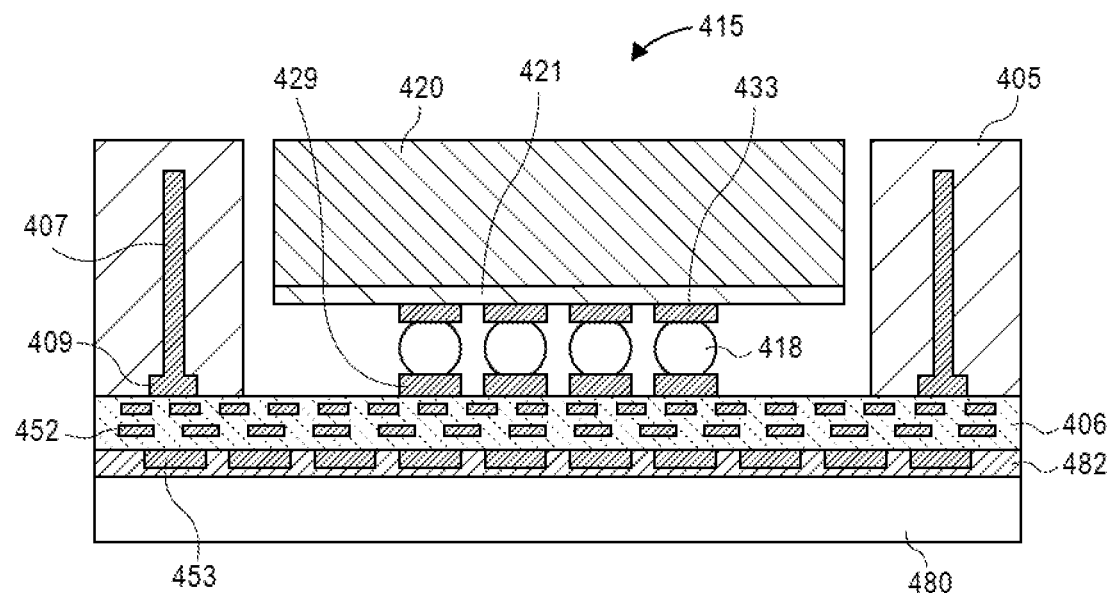
FIG. 4C is a cross-sectional illustration of a component attached to the pads in the cavity, in accordance with an embodiment.

Referring now to FIG. 4C, a cross-sectional illustration after the component 420 is attached to the pads 429 is shown, in accordance with an embodiment. In an embodiment, the component 420 may comprise pads 433 over an active surface 421. The pads 433 may be coupled to the pads 429 with a FLIs 418. The FLIs 418 may comprise solder. In other embodiments, the FLIs 418 may comprise a copper to copper interconnection between the pads 433 and the pads 429.

Figure 4D:
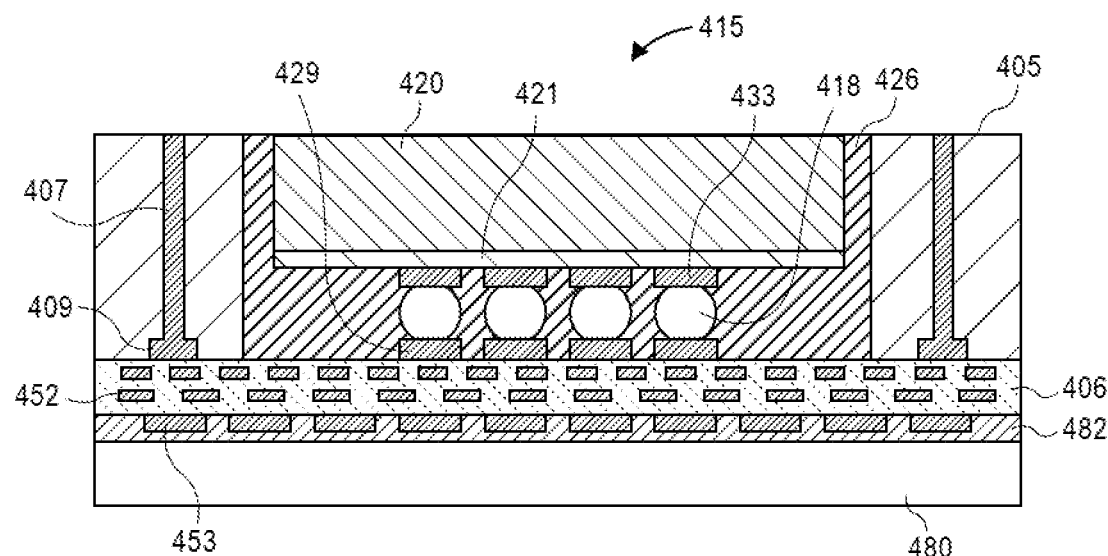
FIG. 4D is a cross-sectional illustration after the cavity is filled with a mold layer and the base substrate is planarized to expose the TSVs, in accordance with an embodiment.

Referring now to FIG. 4D, a cross-sectional illustration after a mold layer 426 is disposed into the cavity 415 is shown, in accordance with an embodiment. In an embodiment, the mold layer 426 may be an epoxy or the like. In the illustrated embodiment, the mold layer 426 may also function as an underfill material that surrounds the FLIs 418. However, other embodiments may include a dedicated underfill material that surrounds the FLIs 418 and that is distinct from the mold layer (e.g., similar to what is shown in FIG. 2F). After the mold layer 426 fills the cavity 415, the base substrate 405 (and the mold layer 426) may be planarized in order to expose the TSVs 407 at the backside surface of the base substrate 405. While not illustrated in FIG. 4D, it is to be appreciated that the planarizing process may also expose TSVs in the component 420 when they are present.

Referring now to FIGS. 5A-5D, a series of cross-sectional illustrations depicting a process for forming a cavity and disposing a component in the cavity with a via last process is shown in greater detail, in accordance with an embodiment.

Figure 5A:
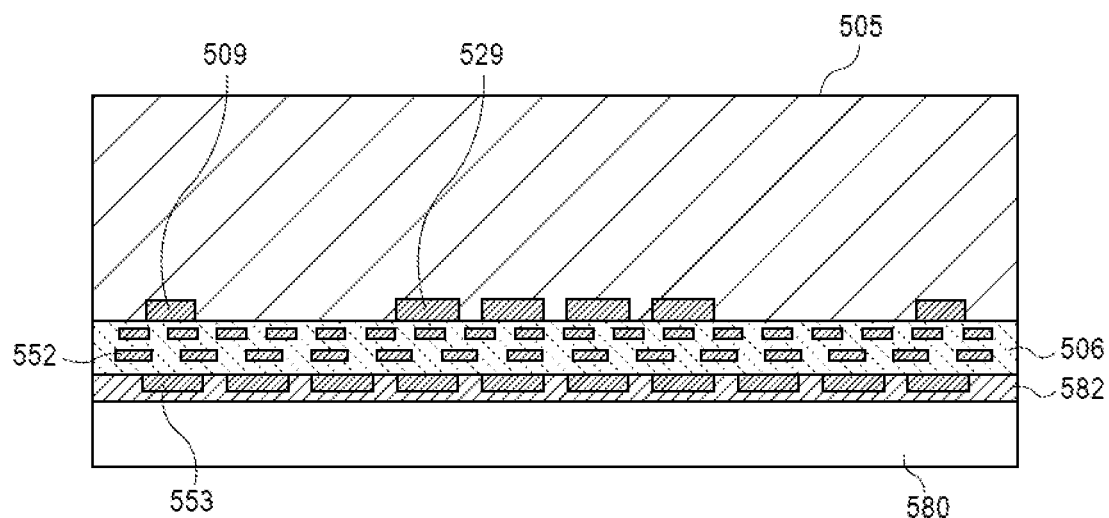
FIG. 5A is a cross-sectional illustration of a base substrate without TSVs, in accordance with an embodiment.

Referring now to FIG. 5A, a cross-sectional illustration of a base substrate 505 on a carrier 580 is shown, in accordance with an embodiment. The base substrate 505 may be attached to the carrier 580 with an adhesive film 582. The adhesive film may cover the surface 506 of the base substrate 505 and any pads 553 over the surface 506. In some embodiments, the surface 506 may comprise conductive features 552, such as traces, pads, vias, and the like that will provide interconnections to components and dies of the electronic package.

In an embodiment, a plurality of pads 529 may be formed along the surface 506 and embedded in the body of the base substrate 505. The pads 529 are located where the component will be attached in a subsequent processing operation. In some embodiments, the pads 529 may be separated from the surface 506 by an insulative liner (e.g., SiN or the like). In contrast to the embodiment shown in FIG. 4A, the base substrate 505 may omit TSVs at this point in the process flow.

Figure 5B:
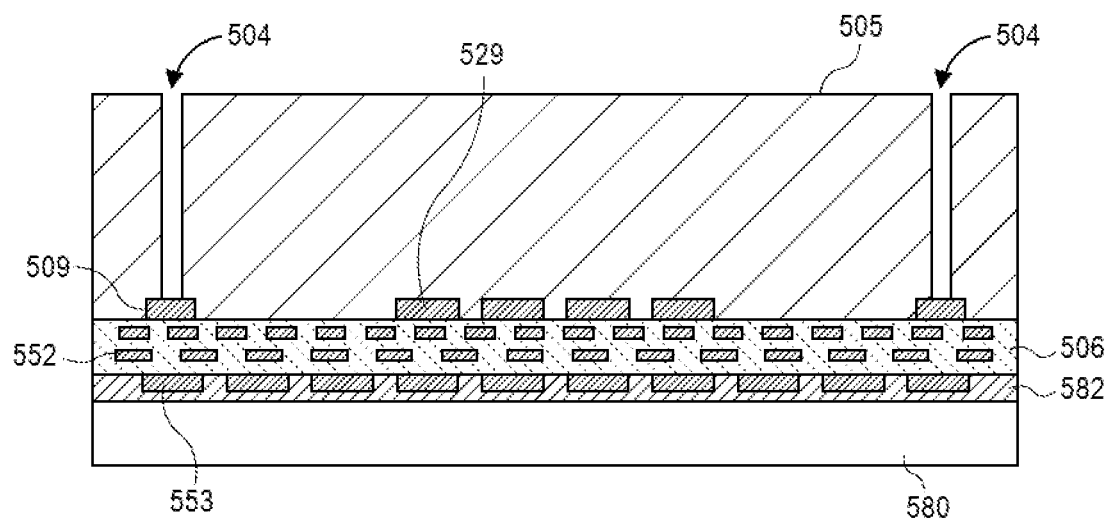
FIG. 5B is a cross-sectional illustration after via openings are formed into the base substrate, in accordance with an embodiment.

Referring now to FIG. 5B, a cross-sectional illustration after via openings 504 are formed into the base substrate 505 is shown, in accordance with an embodiment. In an embodiment, the openings 504 may be formed with an etching process that utilizes a photoresist mask (not shown) to define the openings. In some embodiments, the openings 504 may be lined with an insulating liner (e.g., SiN, or the like). The openings 504 may expose portions of pads 509 embedded in the base substrate 505.

Figure 5C:
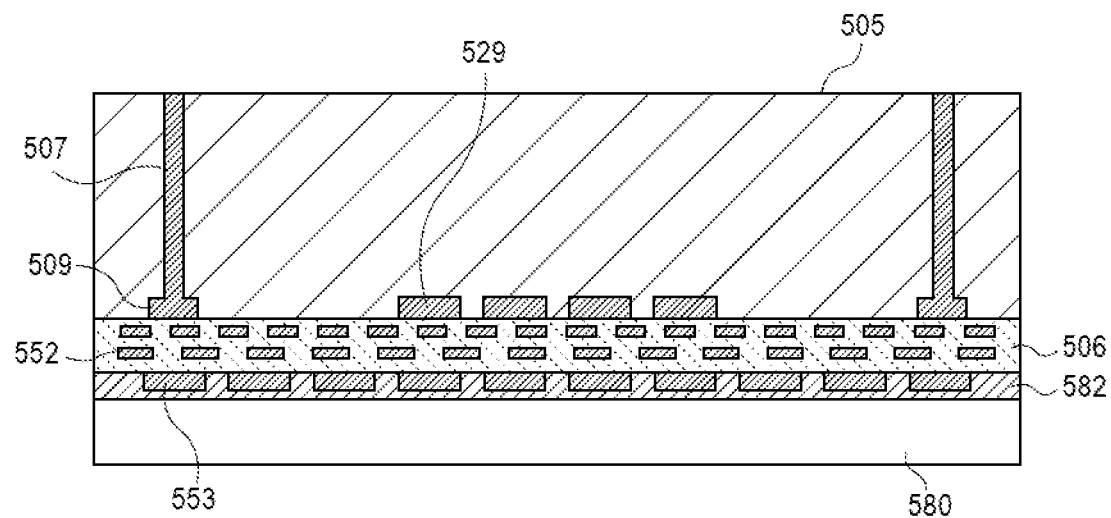
FIG. 5C is a cross-sectional illustration after TSVs are disposed in the via openings, in accordance with an embodiment.

Referring now to FIG. 5C, a cross-sectional illustration after TSVs 507 are disposed in the openings 504 is shown, in accordance with an embodiment. In an embodiment, the TSVs 507 may be plated with any suitable process, such as electroless plating or the like.

Figure 5D:
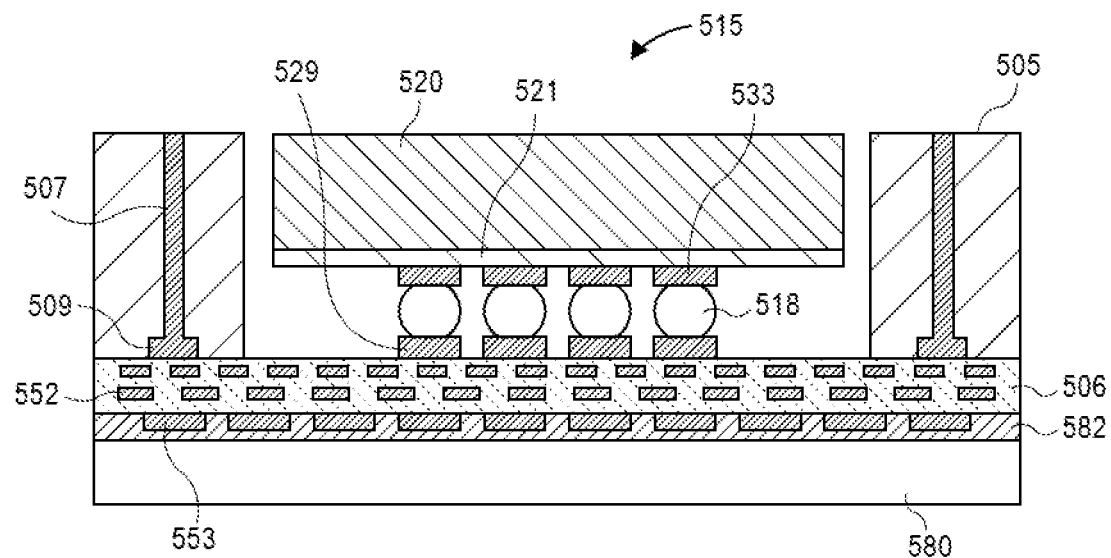
FIG. 5D is a cross-sectional illustration after a cavity is formed into the base substrate and a component is attached to pads in the cavity, in accordance with an embodiment.

Referring now to FIG. 5D, a cross-sectional illustration of the base substrate 505 after a cavity 515 is formed and a component is disposed in the cavity 515 is shown, in accordance with an embodiment. In an embodiment, the cavity 515 may be formed into the base substrate 505 through the backside surface. The cavity 515 may be positioned between TSVs 507 and expose the pads 529. In some embodiments, the cavity 515 may be lined with a lining (not shown) such as a SiN. The exposed pads 529 may also be plated with a conductive barrier layer, or the like.

In an embodiment, the component 520 may comprise pads 533 over an active surface 521. The pads 533 may be coupled to the pads 529 with a FLIs 518. The FLIs 518 may comprise solder. In other embodiments, the FLIs 518 may comprise a copper to copper interconnection between the pads 533 and the pads 529. Subsequent to the attachment of the component 520 to pads 529, the processing flow may continue in substantially the same manner described above with respect to FIG. 4D.

Figure 6:
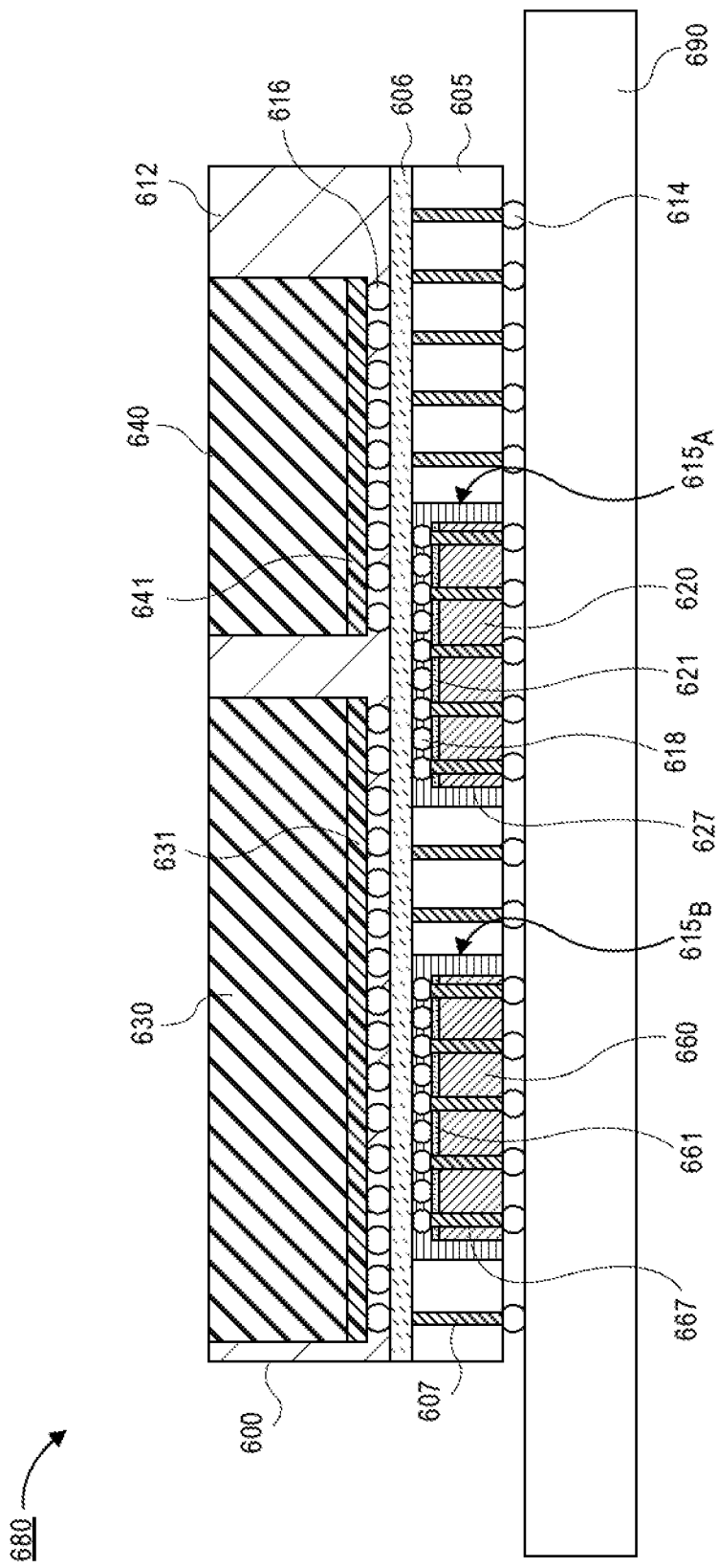
FIG. 6 is a cross-sectional illustration of an electronic system that comprises a multi-chip package, in accordance with an embodiment.

Referring now to FIG. 6, a cross-sectional illustration of an electronic system 680 is shown, in accordance with an embodiment. In an embodiment, the electronic system 680 may comprise an electronic package 600 that is attached to a board 690, such as a printed circuit board (PCB) or the like. In an embodiment, the electronic package 600 may be coupled to the board 690 with PSBs 614 or any other suitable interconnect architecture.

In an embodiment, the electronic package 600 may be any package such as those described above in greater detail. For example, the electronic package 600 may comprise a base substrate 605. In an embodiment, the base substrate 605 may be an active or passive substrate. The base substrate 605 may comprise a surface 606 that includes conductive routing or other conductive features (not shown). The base substrate 605 may comprise silicon. In an embodiment, a plurality of dies (e.g., dies 630 and 640) may be coupled to the base substrate. For example, active surfaces 631 and 641 of the dies 630 and 640 may be attached to the surface 606 with FLIs 616. In an embodiment, the base substrate 605 may comprise TSVs 607. In an embodiment, the plurality of dies 630, 640 may be embedded in a mold layer 612.

In an embodiment, the base substrate 605 may comprise a plurality of cavities (e.g., cavities 615A and 615B). In an embodiment, one or more of the cavities 615 are entirely within a footprint of one of the dies 630, 640. In other embodiments, one or more of the cavities 615 are at least partially within a footprint of a first die 630 and at least partially within a footprint of a second die 640.

In an embodiment, each of the cavities 615 may be filled with a component (e.g., component 620 or component 660). The components 620, 660 may be any of a variety of different component types, such as a die or die stack (e.g., a processor die, a memory die, a power die, a communication die, etc.), a passive component (e.g., a bridge, a capacitor, an inductor, etc.), a cooling module (e.g., a TEC module), or the like. In embodiments where the component 620 and/or 660 is a die or a die stack, the components 620, 660 may be fabricated at a first process node and one or both of the dies 630, 640 may be fabricated at a second process node. In some embodiments, the first process node may be different than the second process node. In an embodiment, the components 620, 660 may comprise active surfaces 621, 661. The active surfaces 621, 661 may be oriented in a face-to-face configuration or back-to-face configuration with the dies 630, 640. In an embodiment, one or both of the components 620, 660 may comprise TSVs 627, 667. The components 620, 660 may be electrically coupled to the surface 606 of the base die 605 with interconnects 618.

Figure 7:
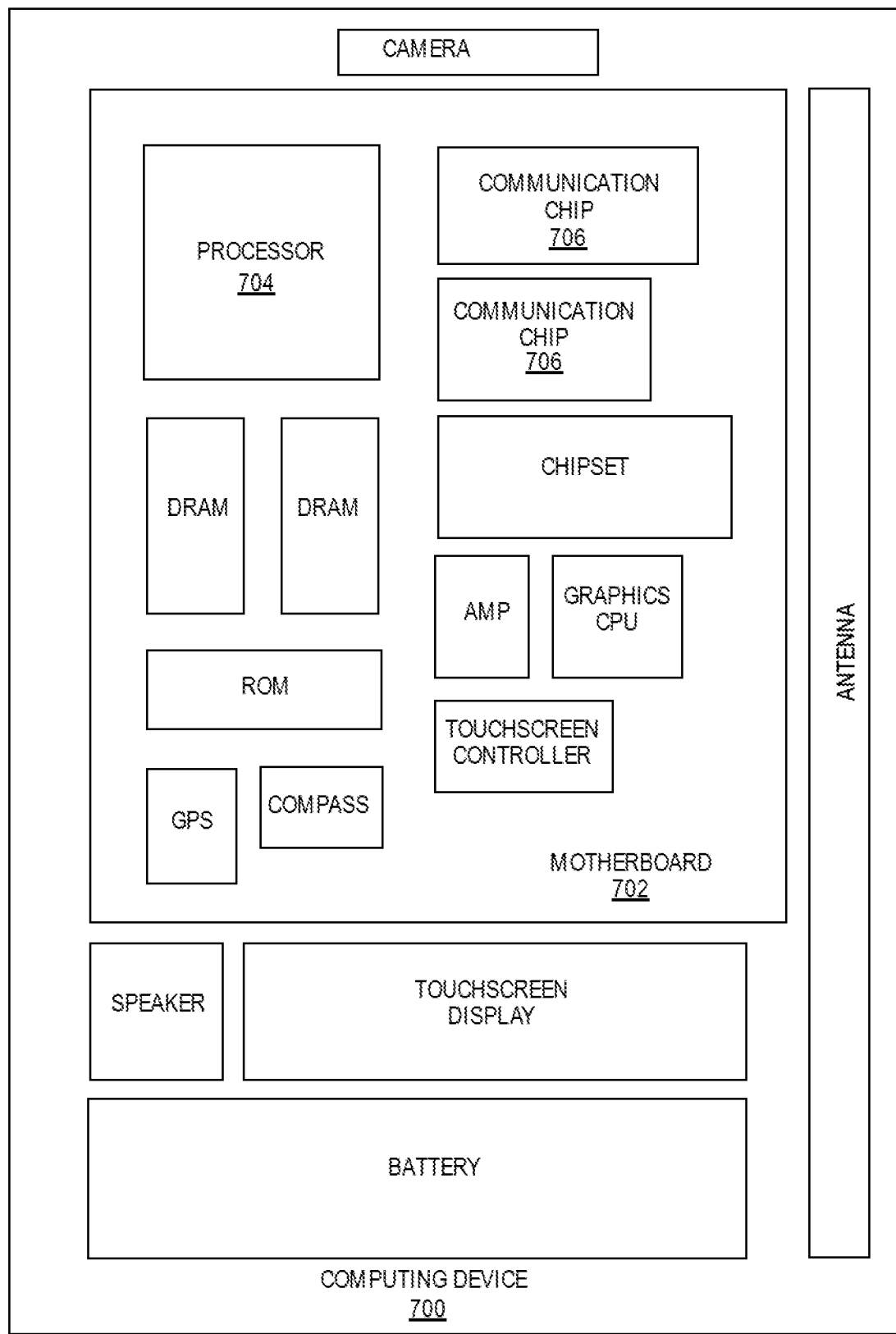
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged in an electronic system that comprises a multi-chip package with a base substrate that comprises a cavity that houses a component, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged in an electronic system that comprises a multi-chip package with a base substrate that comprises a cavity that houses a component, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a base substrate, the base substrate having a plurality of through substrate vias; a first die over the base substrate; a first cavity into the base substrate, wherein the first cavity is at least partially within a footprint of the first die; and a first component in the first cavity.

Example 2: the electronic package of Example 1, wherein the first component is a second die.

Example 3: the electronic package of Example 1 or Example 2, wherein the second die comprises through substrate vias.

Example 4: the electronic package of Examples 1-3, wherein an active surface of the second die faces an active surface of the first die.

Example 5: the electronic package of Examples 1-4, wherein an active surface of the second die faces away from an active surface of the first die.

Example 6: the electronic package of Examples 1-5, wherein the first component is a passive electrical component.

Example 7: the electronic package of Examples 1-6, wherein the first component is a thermoelectric cooling (TEC) module.

Example 8: the electronic package of Examples 1-7, wherein the first cavity is entirely within the footprint of the first die.

Example 9: the electronic package of Examples 1-8, further comprising: a second die over the base substrate.

Example 10: the electronic package of Examples 1-9, wherein the first cavity is at least partially within a footprint of the second die.

Example 11: the electronic package of Examples 1-10, wherein the first component electrically couples the first die to the second die.

Example 12: the electronic package of Examples 1-11, further comprising: a second cavity into the base substrate, wherein the second cavity is entirely within the footprint of the first die.

Example 13: the electronic package of Examples 1-12, further comprising: a second component in the second cavity.

Example 14: the electronic package of Examples 1-13, wherein the first die is electrically coupled to the second die by one or more traces on the base substrate.

Example 15: the electronic package of Examples 1-14, wherein the base substrate is a passive substrate.

Example 16: the electronic package of Examples 1-15, wherein the base substrate is an active substrate.

Example 17: a method of forming an electronic package, comprising: forming through substrate vias (TSVs) partially through a base substrate; thinning the base substrate, wherein the TSVs are not exposed; attaching a carrier to the base substrate; forming a cavity into the base substrate, wherein the cavity exposes a plurality of pads; attaching a component to the plurality of pads; embedding the component within a mold layer; planarizing the base substrate, wherein the planarizing exposes the TSVs; removing the carrier; and attaching a die to the base substrate.

Example 18: the method of Example 17, wherein an active surface of the component faces an active surface of the die.

Example 19: the method of Example 17 or Example 18, wherein the cavity is at least partially within a footprint of the die.

Example 20: the method of Examples 17-19, wherein the component is a second die.

Example 21: the method of Examples 17-20, wherein the second die comprises through substrate vias.

Example 22: an electronic system, comprising: a board; an electronic package coupled to the board, wherein the electronic package comprises: a base substrate, wherein the base substrate comprises through substrate vias (TSVs), and wherein the base substrate comprises silicon; a first die over the base substrate; a second die over the base substrate; a first cavity into the base substrate, wherein the first cavity is at least partially within a footprint of the first die and at least partially within a footprint of the second die; a first component in the first cavity; a second cavity into the base substrate; and a second component in the second cavity.

Example 23: the electronic system of Example 22, wherein the first component electrically couples the first die to the second die.

Example 24: the electronic system of Example 22 or Example 23, wherein the at least one of the first component and the second component comprises through substrate vias.

Example 25: the electronic system of Examples 22-24, wherein an active surface of the first die faces an active surface of the first component.

What is claimed is:

1. An electronic package, comprising:
    a base substrate having a first side and a second side, the second side opposite the first side;
    a component in a cavity of the base substrate, the component having a first side and a second side, the second side opposite the first side, and the component having a first sidewall and a second sidewall between the first side and the second side, the first sidewall laterally opposite the second sidewall;
    a first plurality of through substrate vias in the base substrate, the first plurality of through substrate vias laterally spaced apart from the first sidewall of the component;
    a second plurality of through substrate vias in the base substrate, the second plurality of through substrate vias laterally spaced apart from the second sidewall of the component;
    a mold layer having a first portion laterally between the first plurality of through substrate vias and the first sidewall of the component, the first portion of the mold layer in contact with the first sidewall of the component, and the mold layer having a second portion laterally between the second plurality of through substrate vias and the second sidewall of the component, the second portion of the mold layer in contact with the second sidewall of the component;
    a redistribution layer on the first side of the base substrate, the redistribution layer vertically over the component, vertically over the first plurality of through substrate vias, and vertically over the second plurality of through substrate vias;
    a first plurality of interconnects coupling the first side of the component to the redistribution layer;
    a first die over a first portion of the redistribution layer, the first die over the first plurality of through substrate vias and over a first portion of the component;
    a second plurality of interconnects coupling the first die to the first portion of the redistribution layer;
    a second die over a second portion of the redistribution layer, the second die over the second plurality of through substrate vias and over a second portion of the component;
    a third plurality of interconnects coupling the second die to the second portion of the redistribution layer; and
    a plurality of bumps beneath the second side of the base substrate, the plurality of bumps vertically beneath the second side of the component, vertically beneath the first plurality of through substrate vias, and vertically beneath the second plurality of through substrate vias.

2. The electronic package of claim 1, wherein the redistribution layer is electrically coupled to the first plurality of through substrate vias and to the second plurality of through substrate vias.

3. The electronic package of claim 1, wherein the redistribution layer is electrically coupled to the component by first level interconnects.

4. The electronic package of claim 1, further comprising:
    a second mold layer laterally between the first die and the second die, the second mold layer beneath the first die and beneath the second die.

5. The electronic package of claim 4, wherein the second mold layer has an uppermost surface at a same level as an uppermost surface of the first die and at a same level as an uppermost surface of the second die.

6. The electronic package of claim 1, wherein the base substrate is a silicon substrate.

7. The electronic package of claim 1, wherein the mold layer is not in contact with the first plurality of through substrate vias and is not in contact with the second plurality of through substrate vias.

8. The electronic package of claim 1, wherein the mold layer has a bottommost surface at a same level as a bottommost surface of the component.

9. An electronic package, comprising:
    a base substrate having a first side and a second side, the second side opposite the first side;
    an embedded multi-die interconnect bridge in a cavity of the base substrate, the embedded multi-die interconnect bridge having a first side and a second side, the second side opposite the first side, and the embedded multi-die interconnect bridge having a first sidewall and a second sidewall between the first side and the second side, the first sidewall laterally opposite the second sidewall;
    first vias in the base substrate, the first vias laterally spaced apart from the first sidewall of the embedded multi-die interconnect bridge;

second vias in the base substrate, the second vias laterally spaced apart from the second sidewall of the embedded multi-die interconnect bridge;

a first mold layer having a first portion laterally between the first vias and the first sidewall of the embedded multi-die interconnect bridge, the first portion of the first mold layer in contact with the first sidewall of the embedded multi-die interconnect bridge, and the first mold layer having a second portion laterally between the second vias and the second sidewall of the embedded multi-die interconnect bridge, the second portion of the first mold layer in contact with the second sidewall of the embedded multi-die interconnect bridge;

a redistribution layer on the first side of the base substrate, the redistribution layer electrically coupled to the embedded multi-die interconnect bridge, the redistribution layer on and electrically coupled to the first vias, and the redistribution layer on and electrically coupled to the second vias;

a first plurality of interconnects coupling the first side of the embedded multi-die interconnect bridge to the redistribution layer;

a first die over a first portion of the redistribution layer, the first die over the first vias and over a first portion of the embedded multi-die interconnect bridge;

a second plurality of interconnects coupling the first die to the first portion of the redistribution layer;

a second die over a second portion of the redistribution layer, the second die over the second vias and over a second portion of the embedded multi-die interconnect bridge;

a third plurality of interconnects coupling the second die to the second portion of the redistribution layer;

a second mold layer laterally between the first die and the second die, the second mold layer beneath the first die and beneath the second die; and a plurality of bumps beneath the second side of the base substrate, the plurality of bumps vertically beneath the second side of the embedded multi-die interconnect bridge, vertically beneath the first vias, and vertically beneath the second vias.

10. The electronic package of claim 9, wherein the second mold layer has an uppermost surface at a same level as an uppermost surface of the first die and at a same level as an uppermost surface of the second die.

11. The electronic package of claim 9, wherein the base substrate is a silicon substrate.

12. The electronic package of claim 9, wherein the first mold layer is not in contact with the first vias and is not in contact with the second vias.

13. A method of fabricating an electronic package, the method comprising:

forming a base substrate having a first side and a second side, the second side opposite the first side;

providing a component in a cavity of the base substrate, the component having a first side and a second side, the second side opposite the first side, and the component having a first sidewall and a second sidewall between the first side and the second side, the first sidewall laterally opposite the second sidewall;

forming a first plurality of through substrate vias in the base substrate, the first plurality of through substrate vias laterally spaced apart from the first sidewall of the component;

forming a second plurality of through substrate vias in the base substrate, the second plurality of through substrate vias laterally spaced apart from the second sidewall of the component;

forming a mold layer having a first portion laterally between the first plurality of through substrate vias and the first sidewall of the component, the first portion of the mold layer in contact with the first sidewall of the component, and the mold layer having a second portion laterally between the second plurality of through substrate vias and the second sidewall of the component, the second portion of the mold layer in contact with the second sidewall of the component;

forming a redistribution layer on the first side of the base substrate, the redistribution layer vertically over the component, vertically over the first plurality of through substrate vias, and vertically over the second plurality of through substrate vias;

forming a first plurality of interconnects coupling the first side of the component to the redistribution layer;

providing a first die over a first portion of the redistribution layer, the first die over the first plurality of through substrate vias and over a first portion of the component;

forming a second plurality of interconnects coupling the first die to the first portion of the redistribution layer;

providing a second die over a second portion of the redistribution layer, the second die over the second plurality of through substrate vias and over a second portion of the component;

forming a third plurality of interconnects coupling the second die to the second portion of the redistribution layer; and forming a plurality of bumps beneath the second side of the base substrate, the plurality of bumps vertically beneath the second side of the component, vertically beneath the first plurality of through substrate vias, and vertically beneath the second plurality of through substrate vias.

14. The method of claim 13, wherein the redistribution layer is electrically coupled to the first plurality of through substrate vias and to the second plurality of through substrate vias.

15. The method of claim 13, wherein the redistribution layer is electrically coupled to the component by first level interconnects.

16. The method of claim 13, further comprising:

forming a second mold layer laterally between the first die and the second die, the second mold layer beneath the first die and beneath the second die.

17. The method of claim 16, wherein the second mold layer has an uppermost surface at a same level as an uppermost surface of the first die and at a same level as an uppermost surface of the second die.

18. The method of claim 13, wherein the base substrate is a silicon substrate.

19. The method of claim 13, wherein the mold layer is not in contact with the first plurality of through substrate vias and is not in contact with the second plurality of through substrate vias.

20. The method of claim 13, wherein the mold layer has a bottommost surface at a same level as a bottommost surface of the component.

* * * * *